(12) United States Patent
Lee et al.

(10) Patent No.: US 10,943,544 B2
(45) Date of Patent: Mar. 9, 2021

(54) ORGANIC LIGHT EMITTING DISPLAY DEVICE AND DRIVING METHOD THEREOF

(71) Applicant: LG Display Co., Ltd., Seoul (KR)

(72) Inventors: HongJu Lee, Seoul (KR); JinBong Chung, Gyeonggi-do (KR); Beom-Jin Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 115 days.

(21) Appl. No.: 16/167,957

(22) Filed: Oct. 23, 2018

(65) Prior Publication Data
US 2019/0122616 A1 Apr. 25, 2019

(30) Foreign Application Priority Data

Oct. 24, 2017 (KR) .......................... 10-2017-0138734

(51) Int. Cl.
| | |
|---|---|
| *G09G 5/10* | (2006.01) |
| *G09G 3/3291* | (2016.01) |
| *G09G 3/3266* | (2016.01) |
| *G09G 3/3258* | (2016.01) |
| *G09G 3/3233* | (2016.01) |
| *H01L 27/32* | (2006.01) |
| *G06F 3/01* | (2006.01) |

(52) U.S. Cl.
CPC .......... *G09G 3/3291* (2013.01); *G09G 3/3233* (2013.01); *G09G 3/3258* (2013.01); *G09G 3/3266* (2013.01); *G06F 3/011* (2013.01); *G09G 2300/0426* (2013.01); *G09G 2300/0439* (2013.01); *G09G 2300/0861* (2013.01); *G09G 2310/0262* (2013.01); *G09G 2310/08* (2013.01); *G09G 2330/12* (2013.01); *H01L 27/3276* (2013.01)

(58) Field of Classification Search
None
See application file for complete search history.

(56) References Cited

U.S. PATENT DOCUMENTS

| | | | |
|---|---|---|---|
| 2011/0130981 A1* | 6/2011 | Chaji ................... | G09G 3/3233 702/58 |
| 2014/0139255 A1* | 5/2014 | Chen ..................... | G09G 3/006 324/760.01 |
| 2017/0084243 A1* | 3/2017 | Ohmid Zohoor .... | G09G 3/3659 |
| 2017/0178567 A1* | 6/2017 | Kang ................... | G09G 3/3233 |

* cited by examiner

*Primary Examiner* — Carl Adams
(74) *Attorney, Agent, or Firm* — Morgan, Lewis & Bockius LLP

(57) ABSTRACT

An organic light emitting display device and a driving method thereof may turn on first and second transistors, wherein the first transistor electrically connects a data line and a first node of a driving transistor that drives an organic light emitting diode of each sub-pixel, and the second transistor electrically connects a second node of the driving transistor and a reference voltage line, and may provide a detection driving data voltage and a detection driving reference voltage to the first and second nodes of the driving transistor, respectively, to perform initialization; may turn off the first and second transistors to float the first and second nodes of the driving transistor, and may detect one or more from among a short and to an open of the organic light emitting diode by sensing the voltage of the first node or the second node of the driving transistor.

16 Claims, 13 Drawing Sheets

ORGANIC LIGHT EMITTING DISPLAY DEVICE AND DRIVING METHOD THEREOF

CROSS REFERENCE TO RELATED APPLICATION

This application claims priority from Korean Patent Application No. 10-2017-0138734, filed on Oct. 24, 2017, which is hereby incorporated by reference for all purposes as if fully set forth herein.

BACKGROUND

1. Technical Field

The present disclosure relates to an organic light emitting display device and a driving method thereof.

2. Description of the Related Art

Recently, organic light emitting display devices are coming into the spotlight as display devices which have advantages such as fast response rates, high light emitting efficiency, high luminance, and wide viewing angles because of the use of an organic light emitting diode which emits light by itself.

In organic light emitting display devices, pixels including organic light emitting diodes are arranged in a matrix form, and the brightness of pixels selected by a scan signal is controlled according to the gradation of data.

In organic light emitting display devices, there is the possibility that an alien substance, water, or the like is produced between a first electrode and a second electrode of an organic light emitting diode or is produced in an electrical connection wiring that connects the first electrode and the second electrode, during the manufacturing process before being sent to the market or after being sent to the market.

In this instance, the first electrode and the second electrode in the organic light emitting diode may be shorted or open, or adjacent organic light emitting diodes are electrically shorted and may not act as diodes.

When an organic light emitting diode is electrically shorted, an overcurrent or an abnormal current may flow, which is a drawback. When the first electrode and the second electrode are electrically open, a current may not flow to the organic light emitting diode, which is also a drawback.

Therefore, a corresponding sub-pixel may not normally operate. Accordingly, the quality of an image of the organic light emitting display device may significantly deteriorate.

Recently, various types of electronic devices that require small display devices, such as a virtual reality device, an augmented reality device, and the like, have been provided. Therefore, a micro-display type organic light emitting display device, which is manufactured to be very small in size, has been suggested.

However, it is difficult to check whether the organic light emitting diode is shorted or open due to the size of the micro-display type organic light emitting display device.

SUMMARY

Accordingly, embodiments of the present disclosure are directed to an organic light emitting display device and a driving method thereof that substantially obviate one or more of the problems due to limitations and disadvantages of the related art.

An aspect of the present disclosure is to provide an organic light emitting display device and a driving method thereof, which may detect whether an organic light emitting diode is open.

Another aspect of the present disclosure is to provide an organic light emitting display device and a driving method thereof, which may detect whether an organic light emitting diode is shorted.

Another aspect of the present disclosure is to provide an organic light emitting display device and a driving method thereof, which may detect whether a short occurs between adjacent organic light emitting diodes.

Another aspect of the present disclosure is to provide an organic light emitting display device and a driving method thereof, in which a micro-display type organic light emitting display device does not have a separate pad and determines whether an organic light emitting diode is open or shorted using an embedded detection circuit.

Another aspect of the present disclosure is to provide an organic light emitting display device and a driving method thereof, which may reduce the size of a chip and the manufacturing costs of a micro-display type organic light emitting display device.

Another aspect of the present disclosure is to provide an organic light emitting display device and a driving method thereof, which may determine whether an organic light emitting diode is open and shorted before the organic light emitting display device is packaged, so as to reduce unnecessary packing costs.

Another aspect of the present disclosure is to provide an organic light emitting display device and a driving method thereof, which may reduce the time expended for testing the organic light emitting display device.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an organic light emitting display device comprises a pixel array in which a plurality of sub-pixels defined by a plurality of data lines and a plurality of gate lines are disposed, wherein an organic light emitting diode, a driving transistor driving the organic light emitting diode, a first transistor electrically connecting a first node of the driving transistor and a data line, a second transistor electrically connecting a second node of the driving transistor and a reference voltage line, and a capacitor connecting the first node and the second node of the driving transistor are disposed in each sub-pixel.

The organic light emitting display device may further include: a driving circuit configured to drive the pixel array; and a detection circuit configured to detect one or more from among a short and an open of the organic light emitting diode.

In the organic light emitting display device, the driving circuit may provide a detection driving data voltage and a detection driving reference voltage to the first node and the second node of the driving transistor, respectively.

In the organic light emitting display device, the detection circuit may detect one or more from among a short and an open of the organic light emitting diode according to a voltage of the first node or the second node of the driving transistor after the first node and the second node of the driving transistor are floated.

In the organic light emitting display device, the detection circuit may include a driving controller configured to control the driving circuit such that the detection driving data voltage and the detection driving reference voltage are provided to the first node and the second node of the driving transistor, respectively, and the first node and the second node of the driving transistor are floated.

In the organic light emitting display device, the detection circuit may include a sensor configured to sense a voltage of the first node or the second node of the driving transistor and to output a sensing value when the sensor is electrically connected to the first node or the second node of the driving transistor after the first node and the second node of the driving transistor are floated.

In the organic light emitting display device, the detection circuit may include a determiner configured to detect one or more from among a short and an open of the organic light emitting diode, based on the sensing value output from the sensor.

In the organic light emitting display device, the driving circuit may include: a source driving circuit configured to drive the plurality of data lines; a gate driving circuit configured to drive the plurality of gate lines; and a controller configured to control the source driving circuit and the gate driving circuit.

In the organic light emitting display device, the driving controller may be configured to: perform initialization by turning on the first transistor so as to provide the detection driving data voltage corresponding to predetermined gradation data to the first node of the driving transistor, and turning on the second transistor so as to provide the detection driving reference voltage to the second node of the driving transistor; turn off the first and second transistors, so as to float the first node and the second node of the driving transistor; and perform control such that the first node or the second node of the driving transistor is electrically connected to the sensor, after a predetermined period of time elapses.

In the organic light emitting display device, the determiner may be configured to: compare the sensing value output by the sensor with a reference sensing value obtained in advance according to the detection driving data voltage in a normal state in which a short or an open does not occur in the organic light emitting diode; determine that the organic light emitting diode is open when the sensing value is at least a threshold range higher than the reference sensing value; and determine that the organic light emitting diode is shorted when the sensing value is at least a threshold range lower than the reference sensing value.

In another aspect, in the organic light emitting display device, the driving circuit may provide different detection driving data voltages to adjacent sub-pixels from among the plurality of sub-pixels according to a predetermined data pattern.

In the organic light emitting display device, the detection circuit may detect a short error occurring between organic light emitting diodes of the adjacent sub-pixels according to a voltage of the first node or the second node of the driving transistor.

In another aspect, there is provided a driving method of an organic light emitting display device including: a pixel array in which a plurality of sub-pixels defined by a plurality of data lines and a plurality of gate lines are disposed, wherein an organic light emitting diode, a driving transistor driving the organic light emitting diode, a first transistor electrically connecting a first node of the driving transistor and a data line, a second transistor electrically connecting a second node of the driving transistor and a reference voltage line, and a capacitor connecting the first node and the second node of the driving transistor are disposed in each sub-pixel; a driving circuit; and a detection circuit.

The driving method of the organic light emitting display device may comprise: performing initialization by turning on the first transistor so as to provide a detection driving data voltage corresponding to predetermined gradation data to the first node of the driving transistor, and by turning on the second transistor so as to provide a detection driving reference voltage to the second node of the driving transistor.

The driving method of the organic light emitting display device may include: turning off the first and second transistors after the first node and the second node of the driving transistor are initialized, so as to float the first node and the second node of the driving transistor.

The driving method of the organic light emitting display device may include: detecting a voltage of the first node or the second node of the driving transistor within a predetermined period of time after the first node and the second node of the driving transistor are floated, and determining one of a short error and an open error of the organic light emitting diode.

In another aspect, the driving method of the organic light emitting display device may include: performing initialization by turning on the first transistor so as to provide different detection driving data voltages to first nodes of driving transistors of adjacent sub-pixels from among the plurality of sub-pixels according to a predetermined data pattern, and by turning on the second transistor so as to provide a detection driving reference voltage to the second node of the driving transistor.

The driving method of the organic light emitting display device may include: turning off the first and second transistors after the first node and the second node of the driving transistor are initialized, so as to float the first node and the second node of the driving transistor.

The driving method of the organic light emitting display device may include: detecting a voltage of the first node or the second node of the driving transistor within a predetermined period of time after the first node and the second node of the driving transistor are floated, and determining a short error occurring between organic light emitting diodes of the adjacent sub-pixels.

According to the present embodiments as described above, there may be provided an organic light emitting display device and a driving method thereof, which may detect whether an organic light emitting diode is open.

Also, according to the present embodiments, there may be provided an organic light emitting display device and a driving method thereof, which may detect whether an organic light emitting diode is shorted.

Also, according to the present embodiments, there may be provided an organic light emitting display device and a driving method thereof, which may detect whether a short occurs between adjacent organic light emitting diodes.

Also, according to the present embodiments, there may be provided an organic light emitting display device and a driving method thereof, in which a micro-display type organic light emitting display device does not have a separate pad and determines whether an organic light emitting diode is open or shorted using an embedded detection circuit.

Also, according to the present embodiments, there may be provided an organic light emitting display device and a driving method thereof, which may reduce the size of a chip and the manufacturing costs of a micro-display type organic light emitting display device.

Also, according to the present embodiments, there may be provided an organic light emitting display device and a driving method thereof, which may determine whether an organic light emitting diode is open and shorted before the organic light emitting display device is packaged, so as to reduce unnecessary packing costs.

Also, according to the present embodiments, there may be provided an organic light emitting display device and a driving method thereof, which may reduce the time expended for testing the organic light emitting display device.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings.

DETAILED DESCRIPTION

Figure 1:
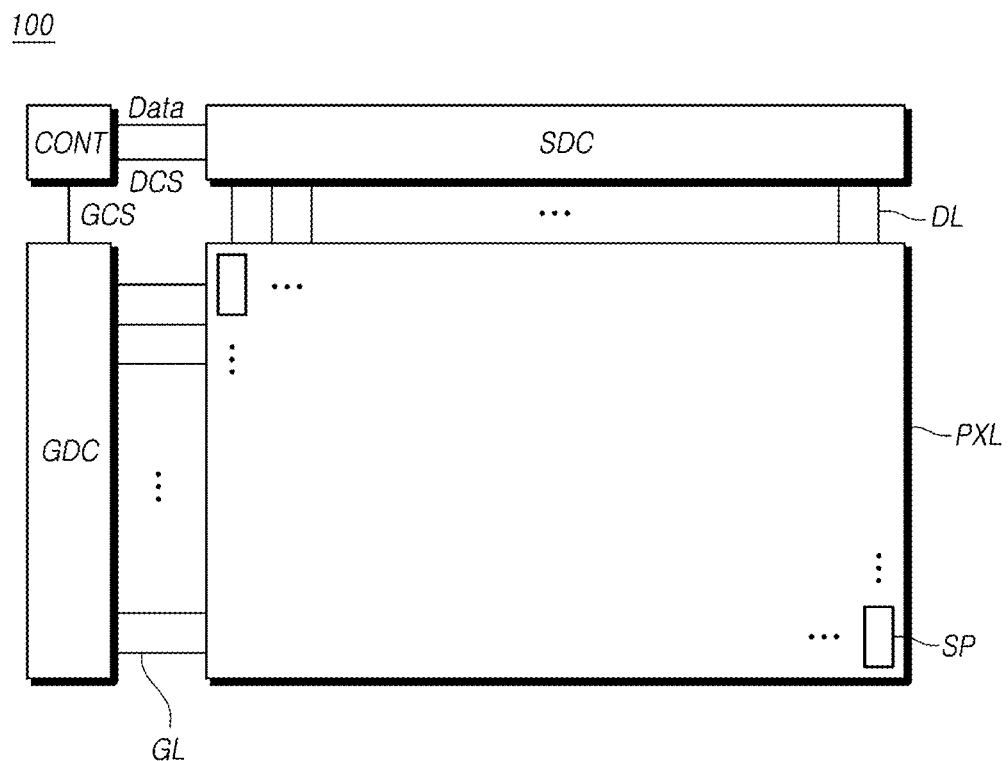
FIG. 1 is a system diagram illustrating an organic light emitting display device according to the embodiments.

Hereinafter, embodiments of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a system diagram illustrating an organic light emitting display device according to the present embodiments.

Referring to FIG. 1, a organic light emitting display device 100 according to various embodiments may include: a pixel array (PXL) in which a plurality of data lines (DLs) and a plurality of gate lines (GLs) are disposed, and which includes a plurality of sub-pixels (SPs) defined by the plurality of data lines (DLs) and the plurality of gate lines (GLs); a driving circuit for driving the plurality of data lines (DLs) and the plurality of gate lines (GLs); a controller (CONT) for controlling the driving circuit; and the like.

The driving circuit may include a source driving circuit (SDC) for driving the plurality of data lines (DLs), a gate driving circuit (GDC) for driving the plurality of gate lines (GLs), and the like.

The controller (CONT) supplies various control signals (DCS or GCS) to the source driving circuit (SDC) and the gate driving circuit (GDC), so as to control the source driving circuit (SDC) and the gate driving circuit (GDC).

The controller (CONT) starts scanning according to timing implemented in each frame, converts input image data input from the outside to be suitable for a data signal format used in the source driving circuit (SDC), outputs the converted image data (Data), and controls data driving according to a proper time based on the scanning.

The controller (CONT) may be a timing controller used in a general display technology, or a control device that includes the timing controller and further performs another control function.

The controller (CONT) may be implemented as an element separate from the source driving circuit (SDC), and may be implemented as an integrated circuit in a manner of being integrated with the source driving circuit (SDC).

The source driving circuit (SDC) may receive input of image data from the controller (CONT), and may supply a data voltage to the plurality of data lines (DLs), thereby driving the plurality of data lines (DLs). Here, the source driving circuit (SDC) is also referred to as a data driving circuit.

The source driving circuit (SDC) may be implemented, including at least one source driver integrated circuit (SDIC).

Each source driver integrated circuit (SDIC) may include a shift register, a latch circuit, a digital to analog converter (DAC), an output buffer, and the like.

Each source driver integrated circuit (SDIC) may further include an analog to digital converter (ADC) according to circumstances.

The gate driving circuit (GDC) may sequentially provide a scan signal to the plurality of gate lines (GLs), thereby sequentially driving the plurality of gate lines (GLs). Here, the gate driving circuit (GDC) is also referred to as a scan driving circuit.

The gate driving circuit (GDC) may be implemented, including at least one gate driver integrated circuit (GDIC).

Each gate driver integrated circuit (GDIC) may include a shift register, a level shifter, and the like.

The gate driving circuit (GDC) sequentially supplies scan signals of an on-voltage or an off-voltage to the plurality of gate lines (GLs) under the control of the controller (CONT).

When a particular gate line is open by the gate driving circuit (GDC), the source driving circuit (SDC) converts the image data (DATA) received from the controller (CONT) into an analog-type data voltage and supplies the converted data voltage to the plurality of data lines (DLs).

The source driving circuit (SDC) may be located in only one side of the pixel array (PXL) (e.g., in the upper portion or in the lower portion). In some cases, the source driving circuit (SDC) may be located on both sides (in the upper portion and the lower portion) of the pixel array (PXL) according to a driving scheme, a panel design scheme, or the like.

The gate driving circuit (GDC) may be located in only one side of the pixel array (PXL) (e.g., on the left side or on the right side). In some cases, the gate driving circuit (GDC) may be located on both sides (e.g., on the left side and the right side) of the pixel array (PXL) according to a driving scheme, a panel design scheme, or the like.

A type of circuit element and the number of circuit elements included in each sub-pixel (SP) may be variously determined according to a provided function, a design scheme, and the like.

The pixel array (PXL) may exist in a display panel including a glass substrate and the like, and the source driving circuit (SDC), the gate driving circuit (GDC), and the like may be electrically connected to the display panel in various schemes.

That is, in the organic light emitting display device 100, transistors, various electrodes, various signal wirings, and the like are formed on the glass substrate, whereby a pixel array (PXL) is formed. Integrated circuits corresponding to driving circuits may be mounted in a printed circuit, and may be electrically connected to the display panel via the printed circuit. The existing structure is suitable for medium and large display devices.

Recently, demands for small display devices, such as virtual reality (VR) devices, augmented reality (AR) devices, and the like have been increased.

Accordingly, the organic light emitting display device 100 according to various embodiments may be a small display device showing an excellent display performance or having a structure suitable for electronic devices, such as a VR device, an AR device, or the like. The small display device may be a micro-display type organic light emitting display device, which is manufactured at a very small size.

In this instance, for example, a pixel array (PXL), a source driving circuit (SDC), a gate driving circuit (GDC), and a controller (CONT) may be disposed together on a silicon substrate (silicon semi-conductor substrate).

In the present disclosure, the meaning of "micro" indicates that the size of a display device is small, or may indicate that the manufacturing process is minutely executed although the size of a display device is not small.

Hereinafter, an electronic device using a micro-display type organic light emitting display device will be described.

Figure 2:
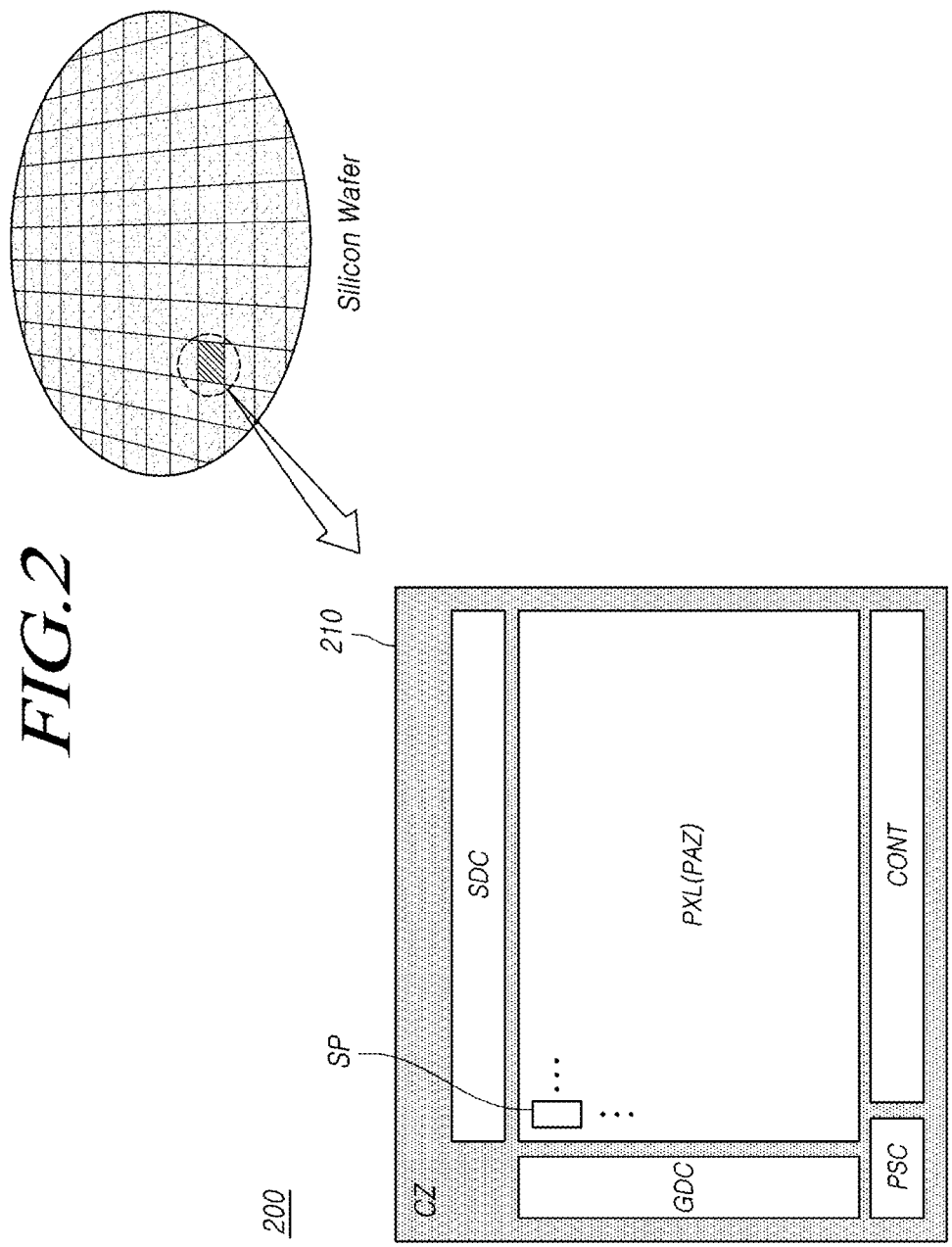
FIG. 2 is a diagram schematically illustrating the structure of a micro-display type organic light emitting display device according to embodiments.

FIG. 2 is a diagram schematically illustrating the structure of a micro-display type organic light emitting display device according to embodiments.

Referring to FIG. 2, a micro-display type organic light emitting display device 200 according to various embodiments may have a backplane structure in which a pixel array (PXL) and various driving circuits are formed on a silicon substrate 210.

The silicon substrate 210 may be a p-type or an n-type. In the present disclosure, "p" indicates a hole, and "n" indicates an electron.

The silicon substrate 210 may include a pixel array zone (PAZ) in which a pixel array (PXL) is disposed, and may include a circuit zone (CZ) in which various driving circuits are disposed.

The circuit zone (CZ) of the silicon substrate 210 may be disposed around the pixel array zone (PAZ) of the silicon substrate 210. For example, the circuit zone (CZ) may exist on one side, two sides, or three sizes of the pixel array zone (PAZ), or may exist, enclosing the pixel array zone (PAZ).

On the pixel array zone (PAZ) of the silicon substrate 210, a plurality of sub-pixels (SPs) are arranged, and in addition, signal wirings for supplying various signals and voltages to the plurality of sub-pixels (SPs) may be disposed.

The signal wirings may include data lines for transferring a data voltage corresponding to an image signal, and gate lines for transferring a scan signal (gate signal).

Also, the signal wirings disposed on the pixel array zone (PAZ) may further include a driving voltage line for transferring a driving voltage. In some cases, a sensing line for transferring a reference voltage or for sensing a voltage or the like may be further included.

Signal wirings disposed on the pixel array zone (PAZ) may be electrically connected to the driving circuits disposed on the circuit zone (CZ) of the silicon substrate 210.

The driving circuits disposed on the circuit zone (CZ) of the silicon substrate 210 may include a source driving circuit (SDC) for driving data lines, a gate driving circuit (GDC) for driving gate lines, and a controller (CONT) for controlling operations of the source driving circuit (SDC), the gate driving circuit (GDC), and the like.

The driving circuits disposed on the circuit zone (CZ) may further include a power supply circuit (PSC) or the like used for supplying various signals and voltages required for driving the sub-pixels (SPs) arranged in the pixel array (PXL) to other circuits (SDC, GDC, and CONT) or to the pixel array (PXL).

Here, the power supply circuit (PSC) may include a power generator such as a DC-DC converter and the like.

The driving circuits disposed on the circuit zone (CZ) of the silicon substrate 210 may further include at least one interface for performing signal input/output, power supply, or communication with other electronic elements.

The interfaces may include one or more from among, for example, a low-voltage differential signaling (LVDS) interface, a mobile industry processor interface (MIPI), a serial interface, and the like.

Also, a pad unit (not illustrated) including a plurality of pads may be disposed on the circuit zone (CZ) of the silicon substrate 210, so as to electrically connect the driving circuits to other electronic elements outside the silicon substrate 210.

The plurality of pads of the pad unit may be used for performing signal input/output, power supply, or communication. The pad unit may be disposed on one side of the silicon substrate 210, or may be dispersively disposed in various locations. When the pad unit is disposed in an edge of the silicon substrate 210, electrical connection to other electric elements and designing the disposition of the driving circuits may be readily performed.

As described above, the micro-display type organic light emitting display device 200 may form all of a pixel array (PXL) and driving circuits, such as a source driving circuit (SDC), a gate driving circuit (GDC), a controller (CONT), a power supply circuit (PSC), and the like, on the silicon substrate 210, whereby the size of a device may be decreased and the manufacturing process may be easily and quickly performed.

The gate driving circuit (GDC) may exist on one side of the pixel array (PXL), or may exist on both sides (on the left side and the right side or in the upper portion and the lower portion) of the pixel array (PXL).

Also, the source driving circuit (SDC) may exist on one side of the pixel array (PXL), or may exist on both sides (on the left side and the right side or in the upper portion and the lower portion) of the pixel array (PXL).

When a single source driving circuit (SDC) is disposed on one side (e.g., in the upper portion) of the pixel array (PXL) in the micro-display type organic light emitting display device 200, the controller (CONT) may be disposed in the other side (e.g., in the lower portion) of the pixel array (PXL) as illustrated in FIG. 2.

However, when the source driving circuit (SDC) is disposed on both sides of the pixel array (PXL), the controller (CONT) may be disposed in the opposite side of the pixel array (PXL) from the gate driving circuit (GDC).

That is, the location of the controller (CONT) maybe variously controlled.

In the micro-display type organic light emitting display device, various circuit devices of a sub-pixel including a driving transistor (DRT) are formed on the silicon substrate 210, and then an organic light emitting diode (OLED) may be formed via a disposition or coherent scheme.

The whole or some of the micro-display type organic light emitting display device 200 according to the various above-described embodiments may be manufactured via a process of manufacturing a silicon wafer.

From the perspective of view, the whole or some of the micro-display type organic light emitting display device 200 according to various embodiments may be a type of integrated circuit which is made via a process of manufacturing a silicon wafer (semiconductor processing).

Therefore, the whole or some of the micro-display type organic light emitting display device 200 according to embodiments may be referred to as a display integrated circuit.

As described above, the micro-display type organic light emitting display device 200 according to various embodiments may be minutely and easily manufactured since the whole or parts thereof are made via the process of manufacturing a silicon wafer.

The pixel array (PXL) including transistors on the pixel array zone (PAZ) of the silicon substrate 210 and the driving circuits including transistors on the circuit zone (CZ) of the silicon substrate 210 may be manufactured via the same process.

Also, in the micro-display type organic light emitting display device 200, various lines, such as a data line (DL), a gate line (GL), a power supply line, and the like may be manufactured on the silicon substrate 210, together with the pixel array (PXL) and the driving circuits.

Figure 3:
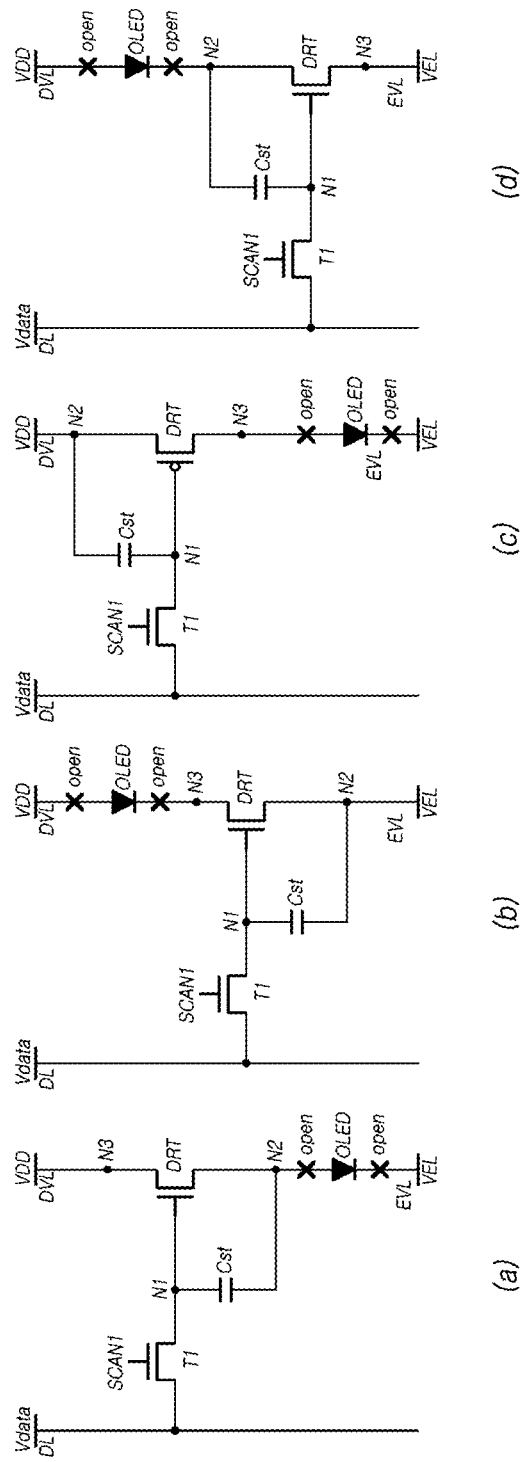
FIG. 3 is a diagram illustrating structures of sub-pixels of an organic light emitting display device according to embodiments.

FIG. 3 is a diagram illustrating structures of sub-pixels of an organic light emitting display device according to embodiments.

(a) to (d) of FIG. 3 are diagrams illustrating different sub-pixel structures.

Referring to FIG. 3, in the organic light emitting display device 100 and 200 according to various embodiments, each sub-pixel (SP) may be implemented, including an organic light emitting diode (OLED), a driving transistor (DRT) for driving the organic light emitting diode (OLED), a first transistor (T1) electrically connecting a first node (N1) of the driving transistor (DRT) and a data line (DL), and a capacitor (Cst) electrically connecting the first node (N1) and a second node (N2) of the driving transistor (DRT).

The organic light emitting diode (OLED) may include a first electrode (e.g., an anode electrode or a cathode electrode), an organic light emitting layer, a second electrode (e.g., a cathode electrode or an anode electrode), and the like.

The first electrode of the organic light emitting diode (OLED) may be electrically connected to the second node (N2) or a third node (N3) of the driving transistor (DRT). A low voltage (VEL) or a driving voltage (VDD) may be provided to the second electrode of the organic light emitting diode (OLED).

Here, the low voltage (VEL) and the driving voltage (VDD) may be a kind of common voltage that is provided to all sub-pixels (SPs). For example, the low voltage (VEL) may be a ground voltage.

The driving transistor (DRT) may supply a driving current (Ioled) to the organic light emitting diode (OLED), thereby driving the organic light emitting diode (OLED).

The driving transistor (DRT) may have the first node (N1), the second node (N2), and the third node (N3).

The first node (N1) of the driving transistor (DRT) is a node corresponding to a gate node, and may be electrically connected to a source node or a drain node of the first transistor (T1).

The capacitor (Cst) electrically connects the first node (N1) and the second node (N2) of the driving transistor (DRT), and may maintain a data voltage (Vdata) corresponding to an image signal voltage, or a voltage corresponding to thereto during one frame time.

Here, the capacitor (Cst) is an intentionally designed external capacitor outside the driving transistor (DRT) rather than a parasitic capacitor (e.g., Cgs or Cgd) corresponding to an internal capacitor existing between the second node (N2) and the first node (N1) of the driving transistor (DRT).

The second node (N2) or the third node (N3) of the driving transistor (DRT) may be electrically connected to the first electrode of the organic light emitting diode (OLED), and may be a source node or a drain node.

The third node (N3) or the second node (N2) of the driving transistor (DRT) is a node to which a driving voltage (VDD) or a low voltage (VEL) is provided, may be electrically connected to a driving voltage line (DVL) for supplying a driving voltage (VDD) or a low voltage line (EVL) for supplying a low voltage (VEL), and may be a drain node or a source node.

The driving transistor (DRT) may be a n-type transistor or a p-type transistor.

(a) and (b) of FIG. 3 are diagrams illustrating sub-pixel structures in which a driving transistor (DRT) is an n-type transistor.

(a) of FIG. 3 illustrates a sub-pixel structure in which an organic light emitting diode (OLED) is disposed between the second node (N2) of the driving transistor (DRT) and a low voltage (VEL). (b) of FIG. 3 illustrates a sub-pixel structure in which an organic light emitting diode (OLED)

is disposed between the third node (N3) of the driving transistor (DRT) and a driving voltage (VDD).

(c) and (d) of FIG. 3 are diagrams illustrating sub-pixel structures in which a driving transistor (DRT) is a p-type transistor. Since the driving transistor (DRT) is a p-type transistor, an organic light emitting diode (OLED) is disposed between the third node (N3) of the driving transistor (DRT) and a low voltage (VEL) in (c) of FIG. 3, and an organic light emitting diode (OLED) is disposed between the second node (N2) of the driving transistor (DRT) and a driving voltage (VDD) in (d) of FIG. 3.

The first transistor (T1) may be controlled to be turned on or off by receiving a first scan signal (SCAN1) from a gate node via a gate line.

The first transistor (T1) is turned on by the first scan signal (SCAN1), and may transfer a data voltage (Vdata) supplied via a data line (DL) to the first node (N1) of the driving transistor (DRT).

The first transistor (T1) may be referred to as a switching transistor.

As described above, each sub-pixel (SP) illustrated in (a) to (d) of FIG. 3 may have a 2T (Transistor) 1C (Capacitor) structure which includes two transistors (DRT, T1) and one capacitor (Cst) for driving an organic light emitting diode (OLED).

The sub-pixel structure (2T1C structure) illustrated in (a) to (d) of FIG. 3 are merely examples for ease of understanding, but a sub-pixel (SP) structure may further include one or more transistors, or may further include one or more capacitors according to function, panel structure, or the like.

Also, depending on cases, each of a plurality of sub-pixels of a pixel array (PXL) may be provided in the same structure, and some of the plurality of sub-pixels may be provided in different structures.

In the structures of sub-pixels of the organic light emitting display device, as illustrated in (a) to (d) of FIG. 3, when an open occurs between an organic light emitting layer and the first electrode or the second electrode of the organic light emitting diode (OLED) or an open occurs between an electrical wiring and the first electrode or the second electrode, the organic light emitting diode may not act as a diode.

When the organic light emitting diode (OLED) is open, a current may not flow or a meager current may flow. Therefore, the organic light emitting diode (OLED) may not emit light, and a corresponding sub-pixel may abnormally operate.

Figure 4:
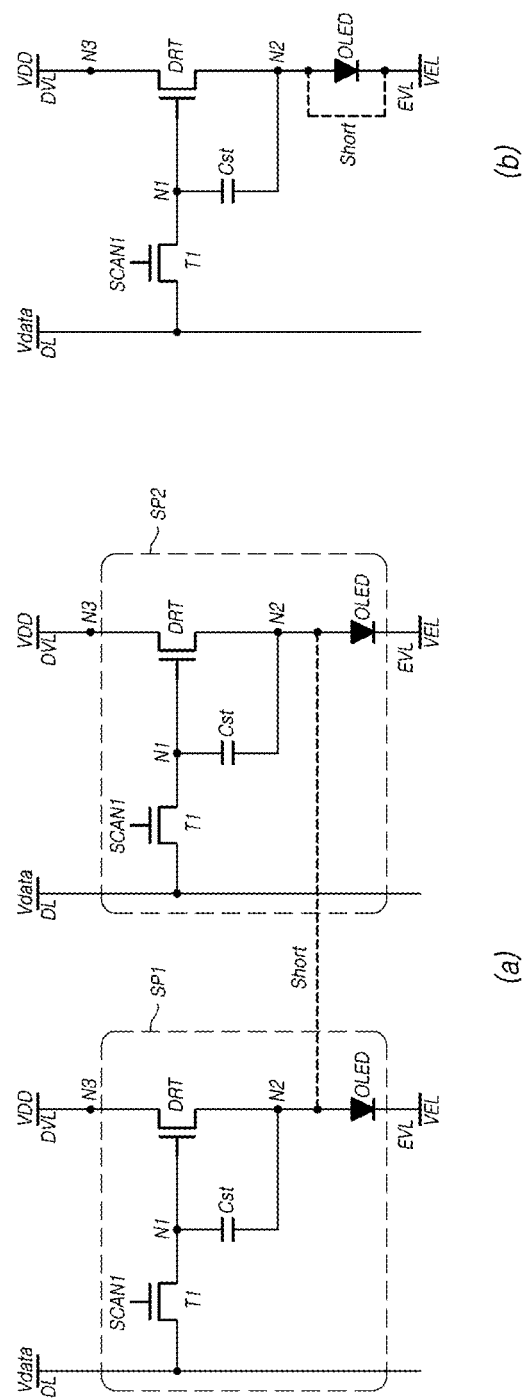
FIG. 4 is a diagram illustrating a short occurring in an organic light emitting diode in a sub-pixel structure of an organic light emitting display device according to various embodiments.

FIG. 4 is a diagram illustrating a short occurring in an organic light emitting diode (OLED) in a sub-pixel structure of an organic light emitting display device according to various embodiments.

An alien substance, water, or the like may be produced between a first electrode and a second electrode of the organic light emitting diode (OLED), during the manufacturing process before being sent to the market or after being sent to the market.

In this instance, the organic light emitting diode (OLED) may be shorted.

The short of the organic light emitting diode (OLED) may occur as a short occurs between first electrodes or second electrodes of organic light emitting diodes (OLEDs) of adjacent sub-pixels SP1 and SP2, as illustrated in (a) of FIG. 4. As illustrated in (b) of FIG. 4, a short may occur between a first electrode and a second electrode of an organic light emitting diode (OLED) in a single sub-pixel (SP).

When an organic light emitting diode (OLED) is shorted, an over current flows or an abnormal current flows, whereby a corresponding sub-pixel may abnormally operate.

Therefore, when the organic light emitting diode (OLED) is shorted or open, the quality of an image of the organic light emitting display device may significantly deteriorate.

Particularly, when the organic light emitting diode (OLED) is formed via a disposition or coherent scheme, a short error or an open error of the organic light emitting diode (OLED) may more frequently occur. That is, in the micro-display type organic light emitting display device 200, a short error or an open error of an organic light emitting diode (OLED) may more frequently occur.

However, in the micro-display type organic light emitting display device 200, it is difficult to electrically connect each line to an external device (e.g., a measuring device). In order to connect each line to the external device, a plurality of pads (PADs) may be needed. The pads (PADs) may significantly affect the size of the micro-display type organic light emitting display device 200, and thus, the pads need to be minimized to improve productivity.

Therefore, it is difficult for an external device to determine whether an organic light emitting diode (OLED) is shorted or open, by being electrically connected to the micro-display type organic light emitting display device 200. Also, this may be a factor that increases costs.

Also, the micro-display type organic light emitting display device 200 is a small display device, and visual examination thereof may not be easy.

Accordingly, an organic light emitting display device may internally determine whether an organic light emitting diode (OLED) is shorted or open in the present embodiments.

Although FIG. 4 has illustrated a short occurring in an organic light emitting diode (OLED) based on the sub-pixel structure illustrated in (a) of FIG. 3, the same type of short may occur in the sub-pixel structures illustrated in (b) to (d) of FIG. 3.

Figure 5:
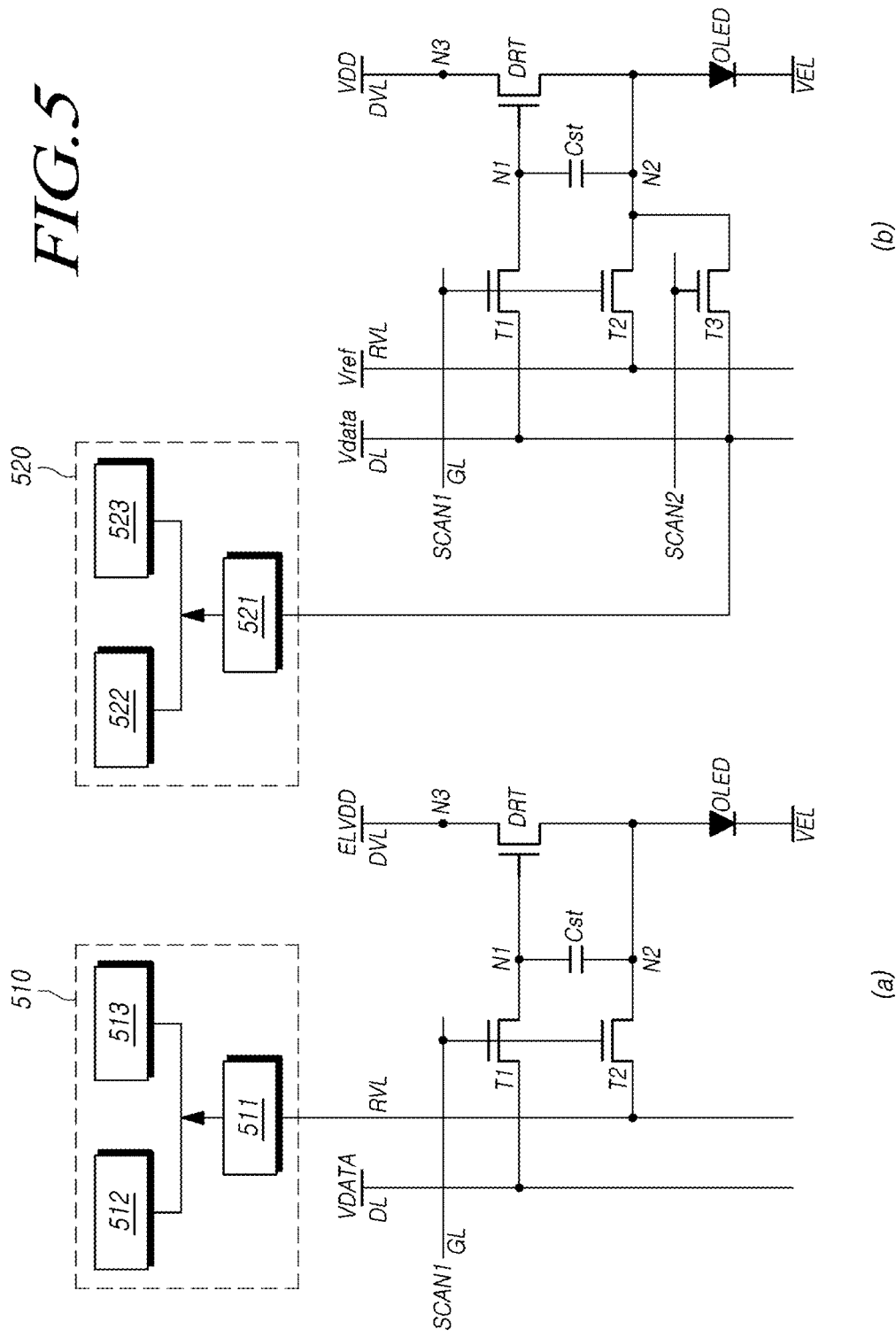
FIG. 5 is a diagram illustrating a detection circuit of an organic light emitting diode of an organic light emitting display device according to various embodiments.

FIG. 5 is a diagram illustrating a detection circuit of an organic light emitting diode of an organic light emitting display device according to various embodiments.

FIG. 5 illustrates a sub-pixel structure including an additional transistor for determining a short and an open of organic light emitting diode (OLED), and the configuration of a detection circuit 510, 520.

(a) of FIG. 5 illustrates an example of a 3T (Transistor) 1C (Capacitor) structure, in which a single sub-pixel (SP) further includes a second transistor (T2) that electrically connects a second node (N2) of a driving transistor (DRT) and a reference voltage line (RVL).

FIG. 5 illustrates an example of a sub-pixel structure that includes an additional transistor in the sub-pixel structure of (a) of FIG. 3. The sub-pixel structures of (b) to (d) of FIG. 3 may be also configured to additionally include a transistor, so as to determine a short or an open of an organic light emitting diode (OLED).

In FIG. 5, the second transistor (T2) is electrically connected between the second node (N2) of the driving transistor (DRT) and the reference voltage line (RVL), and may be provided with a first scan signal (SCAN1) via a gate node, whereby the second transistor (T2) may be controlled to be turned on or off.

A drain node or a source node of the second transistor (T2) is electrically connected to the reference voltage line (RVL), and the source node or the drain node of the second transistor (T2) may be electrically connected to the second node (N2) of the driving transistor (DRT).

For example, the second transistor (T2) may be turned on during a display driving time period, and may be turned on during a sensing driving time period defined for sensing a characteristic of the driving transistor (DRT) or a characteristic of the organic light emitting diode (OLED).

Also, the second transistor (T2) may be turned on at a test mode defined for detecting a short or an open of the organic light emitting diode (OLED).

The second transistor (T2) may be turned on by a first scan signal (SCAN1) at a corresponding driving timing, and may transfer a reference voltage (Vref), which is supplied to a reference voltage line (RVL), to the second node (N2) of the driving transistor (DRT).

Also, the second transistor (T2) may be turned on by a first scan signal (SCAN1) at another driving timing, and may transfer a voltage of the second node (N2) of the driving transistor (DRT) to the reference voltage line (RVL).

In this instance, a sensor (e.g., an analog-digital converter or the like) that is elecliically connected to the reference voltage line (RVL) may measure the voltage of the second node (N2) of the driving transistor (DRT) via the reference voltage line (RVL).

In other words, the second transistor (T2) may control the voltage state of the second node (N2) of the driving transistor (DRT), or may transfer the voltage of the second node (N2) of the driving transistor (DRT) to the reference voltage line (RVL).

The first scan signal (SCAN1) may have a turn-on level voltage (e.g., a high-level voltage (VGH) or a low level voltage (VGL)) that is capable of turning on the first transistor (T1) and second transistor (T2), or may have a turn-off level voltage (e.g., a low-level voltage (VGL) or a high-level voltage (VGH)) that is capable of turning off the first transistor (T1) and second transistor (T2).

In (a) of FIG. 5, a sensor 511 of a detection circuit 510 may be electrically connected to the reference voltage line (RVL), and may measure the voltage of the reference voltage line (RVL). The sensor 511, for example, may be implemented as an analog-to-digital converter (ADC), and may output a voltage measurement value (digital value).

The sensor 511 may be embedded in a source driver integrated circuit.

The detection circuit 510 may further include a determiner 512 that determines whether a short and an open occurs between the first electrode and the second electrode of the organic light emitting diode (OLED), based on the voltage measurement value output from the sensor 511.

Using the determiner 512, whether the organic light emitting diode (OLED) is shorted or open may be accurately detected using a voltage measurement value obtained via driving for detecting a short of the organic light emitting diode.

In order to detect an open and a short of the organic light emitting diode (OLED), the detection circuit 510 may further include a driving controller 513 that controls a gate driving circuit (GDC) and a source driving circuit (SDC) such that a designated voltage is provided to the first node (N1) and the second node (N2) of the driving transistor (DRT) and then the first node (N1) and the second node (N2) are floated.

The determiner 512 and the driving controller 513 may be implemented in a manner of being included in the controller (CONT).

Also, the detection circuit 510 may further include a memory (not illustrated) for storing a voltage measurement value output from the sensor 511 or a detection result from the determiner 512. The memory may store a voltage measurement value or a detection result, together with location information of a corresponding sub-pixel.

Therefore, the organic light emitting display device 100 and 200 according to the present embodiments may store and update location information of a sub-pixel, of which an organic light emitting diode (OLED) has a short or an open.

Using the location information of the sub-pixel, of which the organic light emitting diode has a short or an open, a pixel array (PXL) may be repaired.

(b) of FIG. 5 illustrates an example of a 4T (Transistors) 1C (Capacitor) structure, which further includes a third transistor (T3) in addition to a second transistor (T2).

In (b) of FIG. 5, the third transistor (T3) electrically connects a second node (N2) of a driving transistor (DRT) and a data line (DL).

In (b) of FIG. 5, the third transistor (T3) may be turned on by a second scan signal (SCAN2) at a corresponding driving timing, and may transfer a voltage of the second node (N2) of the driving transistor (DRT) to the data line (DL).

In this instance, a sensor 521 that is electrically connected to the data line (DL) may measure the voltage of the second node (N2) of the driving transistor (DRT) via the data line (DL).

Like the detection circuit 510 of (a) of FIG. 5, a detection circuit 520 of (b) of FIG. 5 may include the sensor 521, and may further include a determiner 522 and a driving controller 523. However, the sensor 521 of the detection circuit 520 of (b) of FIG. 5 may be electrically connected to the data line (DL), and may measure the voltage of the data line (DL).

Figure 6:
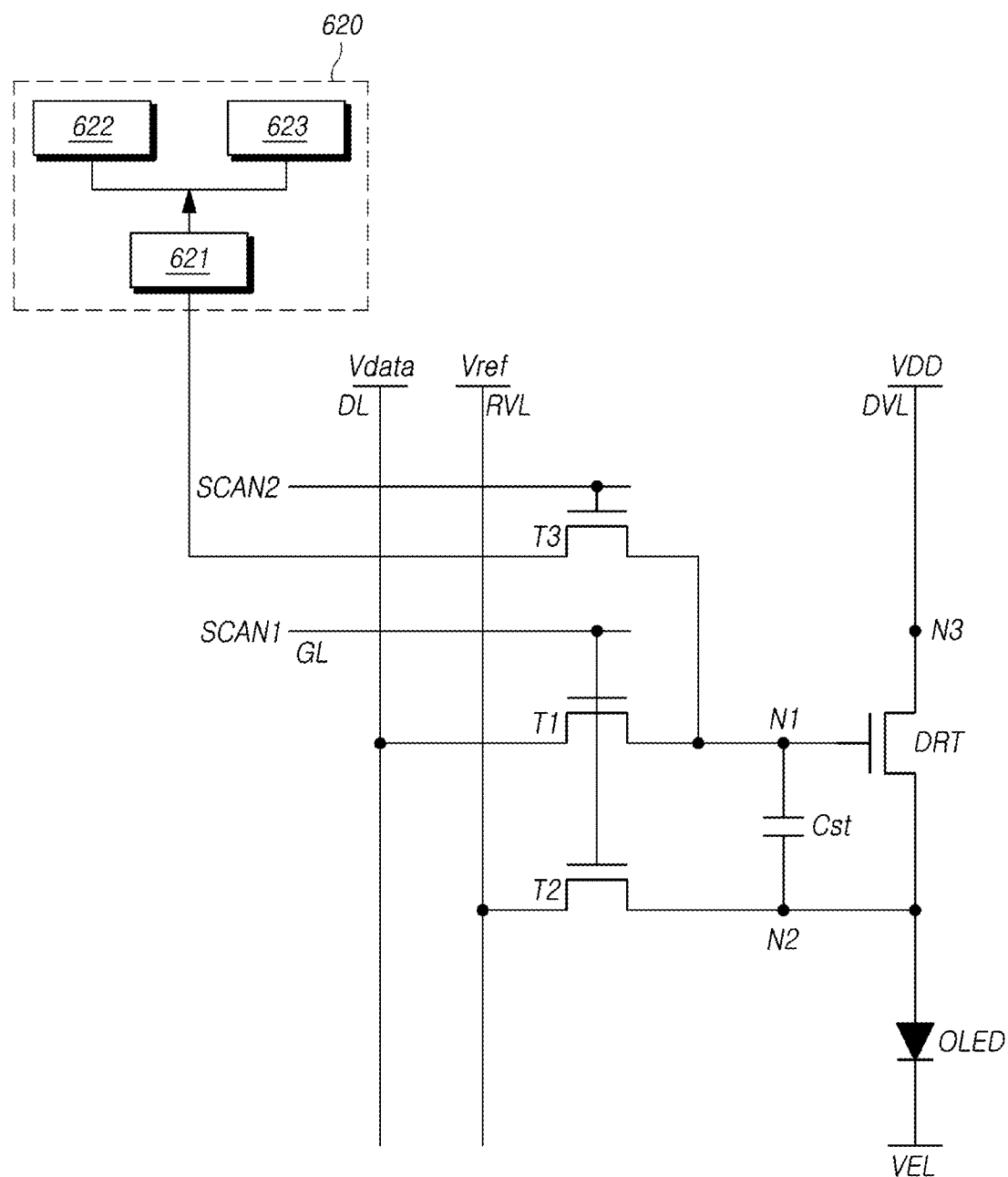
FIG. 6 is a diagram illustrating another sub-pixel structure of an organic light emitting display device according to embodiments.

FIG. 6 is a diagram illustrating another sub-pixel structure of an organic light emitting display device according to embodiments.

FIG. 6 illustrates a 4T (Transistor)1C (Capacitor) sub-pixel structure, which further includes a third transistor (T3), like (b) of FIG. 5. However, in the sub-pixel of FIG. 6, the third transistor (T3) electrically connects a first node (N1) of a driving transistor (DRT) and a data line (DL).

Therefore, the sub-pixel structure of FIG. 6 may be configured to transmit the voltage of the first node (N1) of the driving transistor (DRT) via the data line (DL), unlike the sub-pixel structure of FIG. 5 which is configured to transfer the voltage of the second node (N2) of the driving transistor (DRT).

That is, in the sub-pixel structure of FIG. 6, the voltage of the first node (N1) of the driving transistor (DRT) may be measured via the data line (DL).

A detection circuit 620 of FIG. 6 may also include a sensor 621, and may further include a determiner 622 and a driving controller 623. Also, the sensor 621 may be electrically connected to the data line (DL) in the same manner as the detection circuit 520 of (b) of FIG. 5, and may measure the voltage of the data line (DL).

Although FIGS. 5 and 6 illustrate that a first scan signal (SCAN1) is provided to a gate of the second transistor (T2), which is the same scan signal as that of the transistor (T1), a scan signal, which is different from a scan signal for the first transistor (T1), may be provided to the gate of the second transistor (T2).

Figure 7A:
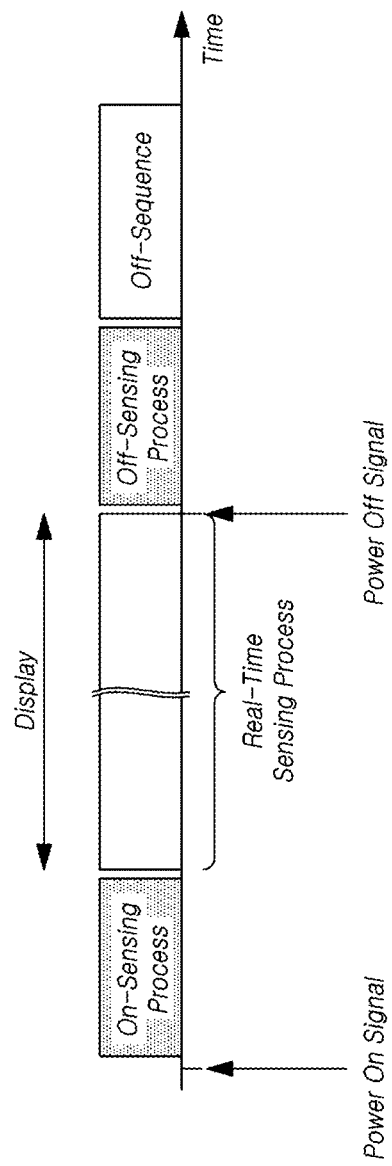
FIGS. 7A and 7B are timing diagrams of the period for detecting an open and a short of an organic light emitting diode according to various embodiments.
Figure 7B:
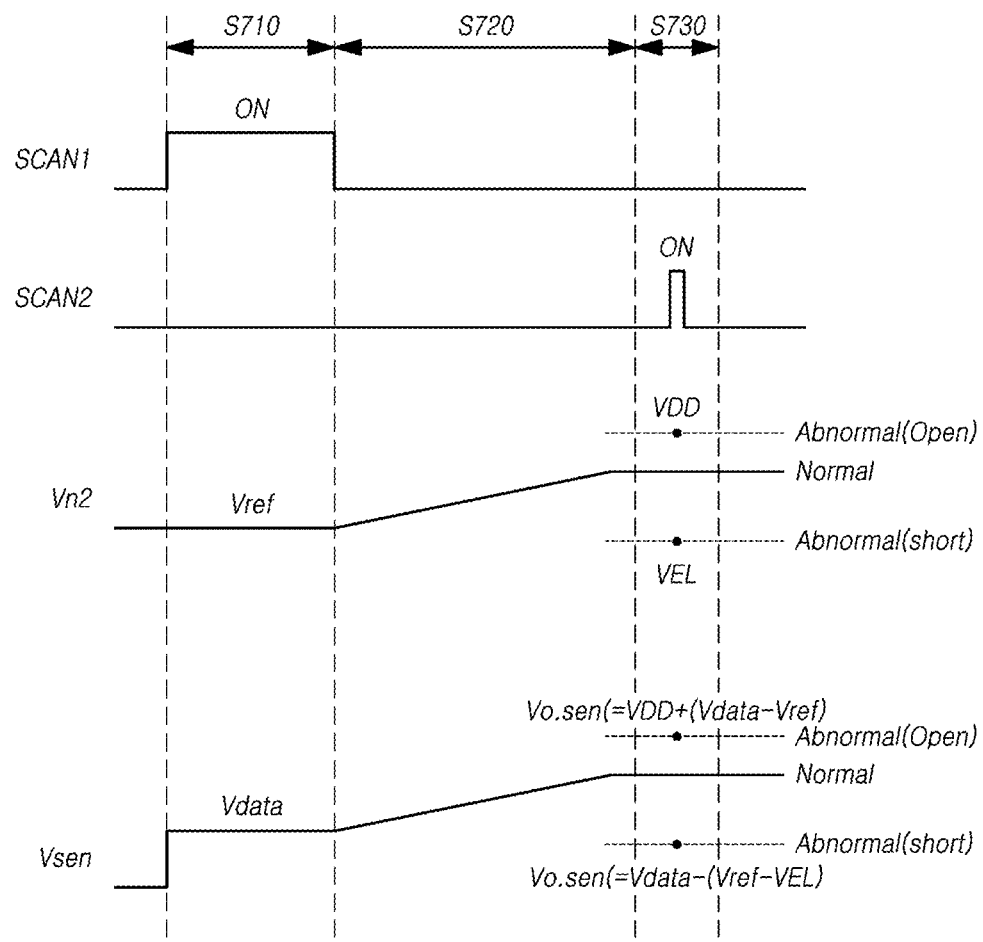

FIGS. 7A and 7B are timing diagrams of the period for detecting an open and a short of an organic light emitting diode according to various embodiments.

An organic light emitting display device according to the present embodiments may perform detecting an open or a short of an organic light emitting diode after the organic light emitting diode (OLED) is formed via a disposition or coherent scheme.

Particularly, an operation of detecting an open or a short of the organic light emitting diode (OLED) may be performed after the organic light emitting diode (OLED) is formed on the silicon substrate 210 in the micro-display type organic light emitting display device 200 and before the organic light emitting display device 200 is packaged.

That is, an open and a short of the organic light emitting diode is determined before the organic light emitting display device is packaged, and thus, unnecessary package costs may be reduced. The operation of detecting an open or a short of the organic light emitting diode may be performed after the organic light emitting display device is packaged.

FIG. 7A is a diagram illustrating a sensing timing of an organic light emitting display device according to the present embodiments.

Referring to FIG. 7A, when a power-on-signal is generated, the organic light emitting display device according to the present embodiments may perform an operation of detecting an open or a short of an organic light emitting diode. The sensing process is referred to as an on-sensing process.

Also, when a power-off-signal is generated, an operation of detecting an open or a short of the organic light emitting diode may be performed before an off-sequence, such as a power down or the like, is performed. The sensing process is referred to as an off-sensing process.

Also, during the period from when a power-on-signal is generated until a power-off-signal is generated, the operation of detecting an open or a short of the organic light emitting diode may be performed for each blank time even through a display is driving. The sensing process is referred to as a real-time sensing process.

The real-time sensing process may be performed for each blank time between active times, based on a vertical synchronization signal (Vsync).

When the operation of detecting an open or a short of the organic light emitting diode is performed via the real-time sensing process, a user may recognize the same as a flicker, and the quality of image may deteriorate.

Accordingly, the operation of detecting an open or a short of the organic light emitting diode may be performed via the on-sensing process or the off-sensing process.

As described above, as an organic light emitting diode detection period starts after a power-on-signal is generated or a power-off-signal is generated, the operation of detecting the organic light emitting diode may be performed without disturbing a user.

FIG. 7B illustrates a change in the voltages of a first node (N1) and a second node (N2) of a driving transistor (DRT) at each of an initialization period S710, a floating period S720, and a detection period S730 in the period for detecting an open and a short of the organic light emitting diode.

Referring to FIG. 7B, the period of detecting an open and a short of the organic light emitting diode may include the initialization period S710, the floating period S720, and the detection period S730.

The initialization period S710 is a period in which the second node (N2) of the driving transistor (DRT) is initialized to have a detection driving reference voltage (Vref) of a predetermined voltage, and the first node (N1) of the driving transistor (DRT) is initialized to have a detection driving data voltage (Vdata) corresponding to predetermined gradation data.

The floating period S720 is a period in which the first node (N1) and the second node (N2) of the driving transistor (DRT) are floated such that the voltages of the first node (N1) and the second node (N2) of the driving transistor (DRT) can be changed according to whether the organic light emitting diode (OLED) is shorted or open.

The detection period S730 is a period in which the sensor 511, 521, and 621 measures the voltage of the first node (N1) or the second node (N2) of the driving transistor (DRT) via a reference voltage line (RVL) or a data line (DL).

The determiner 512, 522, and 622 may determine whether the organic light emitting diode (OLED) of a corresponding sub-pixel (SP) is shorted or open, using a voltage measurement value obtained in the detection period S730.

In FIG. 7B, on the assumption that the voltage of the first node (N1) of the driving transistor (DRT) is sensed by the sensor 621 with reference to FIG. 6, the voltage of the first node (N1) of the driving transistor (DRT) is expressed as a sensing voltage (Vsen) and the voltage of the second node (N2) is expressed as a Vn2.

Hereinafter, based on the sub-pixel structure of FIG. 6, a method of detecting a short or an open of an organic light emitting diode (OLED) will be described with reference to FIG. 7B. Preferentially, a method of detecting an open of an organic light emitting diode (OLED) and a method of detecting a short of an organic light emitting diode (OLED) in each sub-pixel (SP) will be described.

In the initialization period S710, a first transistor (T1) and a second transistor (T2) are turned on based on a first scan signal (SCAN1). A third transistor (T3) is turned off based on a second scan signal (SCAN2).

The turned-on first transistor (T1) electrically connects a data line (DL) and the first node (N1) of the driving transistor (DRT). In this instance, a detection driving data voltage corresponding to predetermined gradation data is provided to the data line (DL).

Therefore, the first node (N1) of the driving transistor (DRT) is initialized to have the detection driving data voltage during the initialization period S710.

When detecting a short or an open of the organic light emitting diode is performed, the first node (N1) of the driving transistor (DRT) may be initialized to have, for example, a detection driving data voltage corresponding to the maximum gradation data.

When it is assumed that the gradation data has a level ranging from 0 to 255 and the organic light emitting diode (OLED) of a sub-pixel (SP) has the maximum brightness at a level of 255, the maximum gradation data may be the gradation data at a level of 255 (gamma,255). In this instance, a data voltage may be the maximum gradation data voltage ($V_{gamma, 255}$). That is, a detection driving data voltage (Vdata) may be set to the maximum gradation data voltage ($V_{gamma, 255}$).

The voltage level of the detection driving data voltage that initializes the first node (N1) of the driving transistor (DRT) is not limited. However, the detection driving data voltage is set to the maximum gradation data voltage ($V_{gamma, 255}$) such that a short or an open of the organic light emitting diode is readily detected.

Also, in the initialization period S710, the turned-on second transistor (T2) electrically connects the second node (N2) of the driving transistor (DRT) and a reference voltage line (RVL). A detection driving reference voltage is provided to the reference voltage line (RVL). Therefore, the second node (N2) of the driving transistor (DRT) may be initialized to have the detection driving reference voltage (Vref).

Therefore, the voltages (Vn1=Vdata, Vn2) of the first node (N1) and the second node (N2) of the driving transistor (DRT) which are initialized in the initialization period S710, and the quantity of electronic charge (QC) charging a capacitor (Cst) may be calculated as shown in Equation 1.

$$V_{data}=V_{gamma,255}, V_{n2}=V_{ref}, Q_C C^*(V_{data}-V_{ref})=C^* (V_{gamma,255}-V_{ref})$$ [Equation 1]

Subsequently, in the floating period S720, the first transistor (T1) and the second transistor (T2) are turned off according to a first scan signal (SCAN1), and the third transistor (T3) remains in a turned-off state according to a second scan signal (SCAN2).

Since the first to third transistors T1 to T3 are in the turned-off state, the first node (N1) and the second node (N2) of the driving transistor (DRT) are in the floating state.

Although the first node (N1) and the second node (N2) are in the floating state, the driving transistor (DRT) may remain in the turned-on state due to the quantity of electronic charge (Qc) in the capacitor (Cst), as shown in Equation 1. Therefore, a driving voltage (VDD) may be provided to the organic light emitting diode (OLED) via the second node (N2).

A current (Ioled) flowing through the organic light emitting diode (OLED), a voltage (Vd) provided to the organic light emitting diode (OLED), and a gate-source voltage (Vgs) which is a voltage between the first node (N1) and the second node (N2) of the driving transistor (DRT) may be calculated as shown in Equation 2.

$$I_{oled} = I_{s,oled} * e^{V_d/nV_T} = \frac{1}{2}\mu C_{ox}\frac{W}{L}(V_{gs} - V_{th})^2,$$ [Equation 2]

$$V_d = nV_T \ln\left[\frac{1}{2I_S}\mu C_{ox}\frac{W}{L}(V_{gs} - V_{th})^2\right],$$

$$V_{gs} = V_{gamma,255} - V_{ref}$$

Here, Is.oled denotes the reverse bias saturation current of the organic light emitting diode (OLED). n denotes an ideality factor. VT denotes the thermal voltage of the organic light emitting diode (OLED). μ and Cox denote the average degree of surface migration and the gate oxide-film size of the driving transistor (DRT), respectively. L and W denote the length and the width of a channel of the driving transistor (DRT), respectively.

In the detection period S730, the first transistor (T1) and the second transistor (T2) remain in the turned-off state according to a first scan signal (SCAN1), and the third transistor (T3) is turned on according to a second scan signal (SCAN2).

That is, the first node (N1) of the driving transistor (DRT) and the data line (DL) are electrically connected. The sensor 621 may measure the voltage of the first node (N1) of the driving transistor (DRT) via the data line (DL).

In the normal state in which a short or an open does not occur in the organic light emitting diode (OLED), a sensing value (Vsen) which is a voltage value measured by the sensor 621 is the sum of the voltage (Vd) provided to the organic light emitting diode (OLED) and the gate-source voltage (Vgs) of the driving transistor (DRT). Accordingly, the sensing value (Vsen) may be measured as a voltage according to Equation 3.

$$V_{sen} = V_d + V_{gs} = V_d + (V_{gamma,255} - V_{ref}) =$$ [Equation 3]

$$nV_T \ln\left[\frac{1}{2I_s}\mu C_{ox}\frac{W}{L}(V_{gs} - V_{th})^2\right] + (V_{gamma,255} - V_{ref})$$

The sensing value (Vsen) measured when the organic light emitting diode (OLED) is in the normal state according to Equation 3 is a reference sensing value. The reference sensing value may be calculated or measured in advance and may be stored in the memory or the like.

When an open occurs in the organic light emitting diode (OLED), a current supplied to the organic light emitting diode (OLED) via the turned-on driving transistor (DRT) may not flow. Accordingly, the voltage of the first electrode of the organic light emitting diode (OLED), that is, the voltage (Vn2) of the second node (N2) of the driving transistor (DRT) may increase.

When the voltage (Vn2) of the second node (N2) of the driving transistor (DRT) increases, the voltage (Vn1=Vsen) of the first node (N1) of the driving transistor (DRT), which is connected to the second node (N2) via the capacitor (Cst), may also increase according to the conservation law of electrical charge.

The voltage (Vn2) of the second node (N2) of the driving transistor (DRT) continuously increases until the current does not flow to the driving transistor (DRT). In this instance, the driving transistor (DRT) may operate in a triode region (also referred to as a linear region).

Due to the driving transistor (DRT) operating in the triode region, the current ($I_{d.thode}$) that flows to the organic light emitting diode (OLED) becomes 0 as shown in Equation 4, and the voltage (Vn2) of the second node (N2) of the driving transistor (DRT) becomes a driving voltage (VDD) level.

$$I_{a,triode} = \frac{1}{2}\mu C_{ox}\frac{W}{L}(V_{gs} - V_{th})V_{ds} =$$ [Equation 4]

$$\frac{1}{2}\mu C_{ox}\frac{W}{L}(V_{gamma,255} - V_{ref} - V_{th}) * (VDD - V_{n2}) = 0,$$

$$V_{n2} = VDD, (V_{gamma,255} - V_{ref} > V_{th})$$

Therefore, a sensing value (Vasen) measured by the sensor 621 in the state in which the organic light emitting diode (OLED) is open may be measured as a voltage according to Equation 5.

$$V_{o.sen} = VDD + (V_{gamma,255} - V_{ref})$$ [Equation 5]

Comparing Equation 3 and Equation 5, it is recognized that the sensing value $V_{o.sen}$ measured by the sensor 621 in the state in which the organic light emitting diode (OLED) is open increases by a difference between Vd and VDD as illustrated in FIG. 7B.

Therefore, the determiner 622 may determine that the organic light emitting diode (OLED) of a corresponding sub-pixel (SP) is open when the voltage level of the current sensing value (Vsen) increases at least a predetermined threshold range higher than the reference sensing value that is measured and stored in advance when the organic light emitting diode (OLED) is in the normal state according to Equation 3.

As illustrated in FIG. 7B, on the assumption that a short occurs between the first electrode and the second electrode of the organic light emitting diode (OLED), the voltage (Vn2) of the second node (N2) of the driving transistor (DRT) may be the voltage level ($V_{n2}+V_{EL}$) of a low voltage (VEL). That is, the voltage (Vn2) of the second node (N2) of the driving transistor (DRT) may decrease when compared to the voltage when the organic light emitting diode (OLED) is in the normal state.

As illustrated in FIG. 7B, the voltage (Vn1=Vsen) of the first node (N1) of the driving transistor (DRT), which is connected via the capacitor (Cst), may also decrease according to the conservation law of electric charge.

Therefore, a sensing value (Vs.sen) measured by the sensor 621 in the state in which the organic light emitting diode (OLED) is shorted may be measured as a voltage according to Equation 6.

$$V_{o.sen} = V_{n1} = V_{data} - V_{ref} + V_{EL} \quad \text{[Equation 6]}$$

Therefore, the determiner 622 may determine that the organic light emitting diode (OLED) of a corresponding sub-pixel (SP) is shorted when the voltage level of the current sensing value (Vs.sen) decreases at least a predetermined threshold range lower than the reference sensing value that is measured and stored in advance when the organic light emitting diode (OLED) is in the normal state according to Equation 3.

It has been described that the detection circuit 620 senses the voltage of the first node (N1) of the driving transistor (DRT) based on the sub-pixel structure of FIG. 6, so as to detect an open or a short of the organic light emitting diode (OLED).

However, even in the case in which the detection circuit 510 and 520 is configured to sense the voltage of the second node (N2) of the driving transistor (DRT) as shown in the sub-pixel structures of (a) and (b) of FIG. 5, the detection circuit 510 and 520 may readily detect an open or a short of the organic light emitting diode (OLED) from a change in the voltage level of the second node (N2) as illustrated in FIG. 7B.

As illustrated in (a) of FIG. 4, a short of the organic light emitting diode (OLED) in the organic light emitting display device may include a short occurring between organic light emitting diodes (OLEDs) of sub-pixels arranged close to each other.

However, as described above, when the same detection driving data voltage (Vdata) is provided to all sub-pixels in the initialization period S710, a sensing value (Vsen) according to Equation 3 may be measured, like the case of the normal state. Therefore, it is difficult to determine whether a short occurs between the organic light emitting diodes (OLEDs) of sub-pixels arranged close to each other.

Therefore, in the case of detecting whether a short occurs between organic light emitting diodes (OLEDs) of sub-pixels arranged close to each other, the present embodiments provide different detection driving data voltages to adjacent sub-pixels from among a plurality of sub-pixels of a pixel array (PXL) according to a predetermined data pattern during the initialization period S710.

Figure 8:
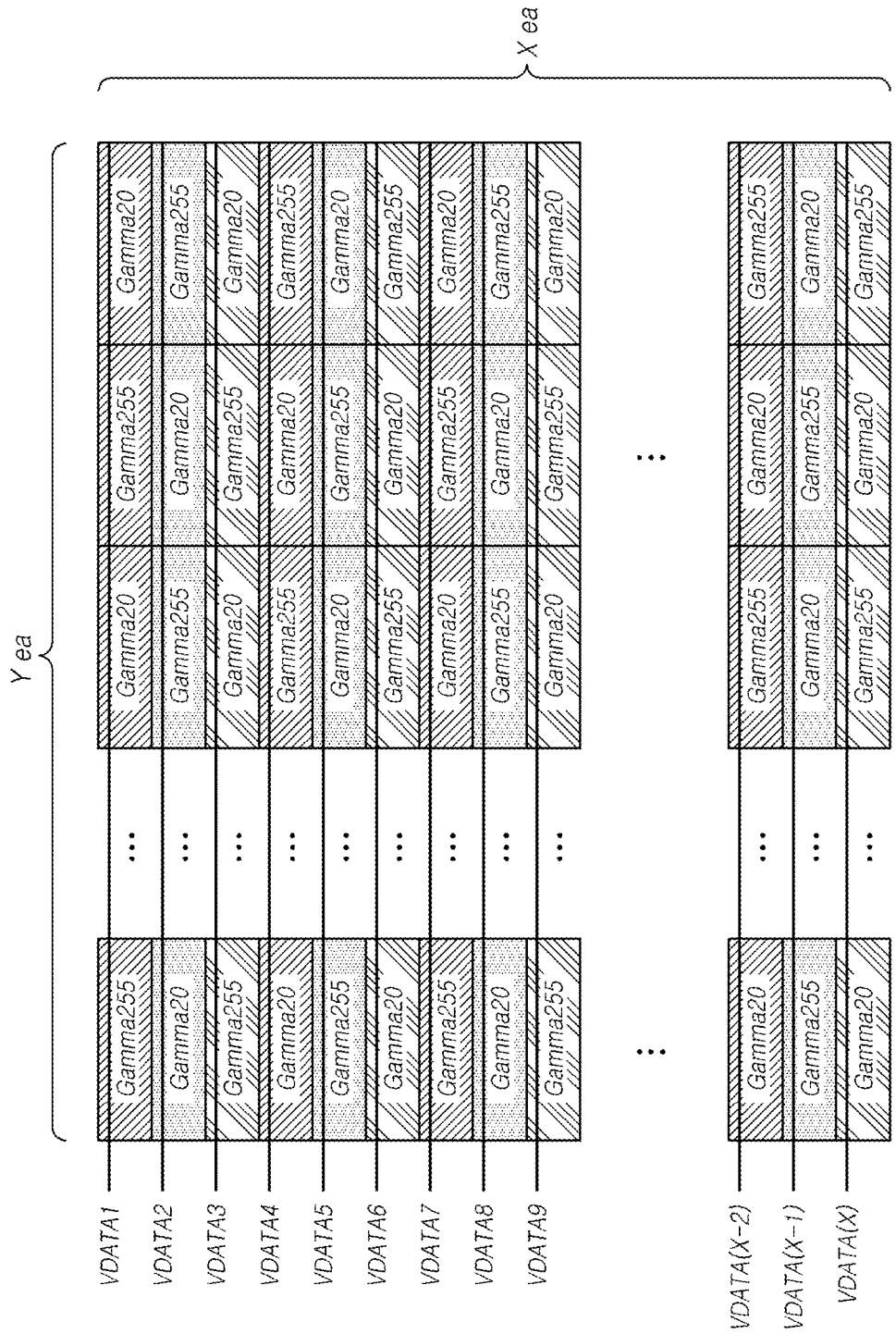
FIG. 8 is a diagram illustrating a data pattern for detecting a short occurring between organic light emitting diodes of sub-pixels according to various embodiments.

FIG. 8 is a diagram illustrating a data pattern for detecting the occurrence of a short between organic light emitting diodes of sub-pixels according to various embodiments.

Although FIG. 8 illustrates, for example, a pixel structure in which a red (R) sub-pixel, a green (G) sub-pixel, and a blue (B) sub-pixel form a single pixel in a pixel array (PXL), four sub-pixels may form a single pixel. For example, the four sub-pixels may be sub-pixels that emit a red (R) light, a green (G) light, a blue (B) light, and a white (W) light, respectively.

Also, although FIG. 8 illustrates that sub-pixels for each color may be arranged in a row or a column, the sub-pixels for each color may be arranged according to a predetermined pattern.

In FIG. 8, a data pattern may be configured such that different detection driving data voltages are provided to adjacent sub-pixels, irrespective of the color of each sub-pixel.

Here, a first detection driving data voltage corresponding to predetermined first gradation data may be provided to some sub-pixels, and a second detection driving data voltage corresponding to predetermined second gradation data may be provided to the remaining adjacent sub-pixels.

Here, the first gradation data and the second gradation data are not limited to predetermined data values. However, in order to readily detect a short occurring between organic light emitting diodes, it is preferable that the first gradation data and the second gradation data are set to have a big difference therebetween.

When at least one of the first gradation data and the second gradation data is set to the minimum gradation data (gamma, 0), a driving transistor (DRT) of a corresponding sub-pixel may be turned off and an organic light emitting diode (OLED) does not operate. Accordingly, the first gradation data or the second gradation data may be set to gradation data having a level greater than or equal to a designated level.

For example, the first gradation data may be the maximum gradation data (gamma, 255), and the second gradation data may be gradation data having a level of 20 (gamma, 20) which is different from the first gradation data.

Hereinafter, a method of detecting a short occurring between organic light emitting diodes (OLEDs) of adjacent sub-pixels (SPs) will be described.

In the case of detecting a short occurring between organic light emitting diodes (OLEDs) of adjacent sub-pixels (SPs), the initialization period S710, the floating period S720, and the detection period S730 are included.

In the initialization period S710, as a first transistor (T1) is turned on, a first node (N1) of a driving transistor (DRT) is initialized to have a detection driving data voltage, and a second node (N2) of the driving transistor (DRT) is initialized to have a detection driving reference voltage (Vref).

However, in the case of detecting a short between organic light emitting diodes (OLEDs) of adjacent sub-pixels (SPs), first nodes (N1) of driving transistors (DRTs) of adjacent sub-pixels (SPs) may be initialized to have different detection driving data voltages as described above.

It is assumed that the first nodes (N1) of the driving transistors (DRTs) of the adjacent sub-pixels (SPs) are initialized to have a first detection driving data voltage (Vdata1) corresponding to first gradation data and a second detection driving data voltage (Vdata2) corresponding to second gradation data, respectively.

In this instance, the quantity of electronic charge (Qc1 and Qc2) in a capacitor (Cst) of each sub-pixel and the current (Id1 and Id2) flowing to an organic light emitting diode (OLED) via a driving transistor (DRT) may be calculated according to Equation 7.

$$Q_{c1} = C * (V_{data1} - V_{ref}), \; Q_{C2} = C * (V_{data2} - V_{ref}) \quad \text{[Equation 7]}$$

$$I_{d1} = \frac{1}{2} \mu C_{ox} \frac{W}{L} (V_{data1} - V_{ref} - V_{th})^2,$$

$$I_{d2} = \frac{1}{2} \mu C_{ox} \frac{W}{L} (V_{data2} - V_{ref} - V_{th})^2$$

Subsequently, in the floating period S720, the first node (N1) and the second node (N2) of the driving transistor (DRT) may be floated. In this instance, when a short has occurred between organic light emitting diodes of adjacent sub-pixels, the currents (Id1 and Id2) flowing through the driving transistors (DRTs) of the two adjacent sub-pixels (SPs) may be the same, and the sum of the two currents may be calculated according to Equation 8.

Here, the currents (Id1 and Id2) flowing through the driving transistors (DRTs) of the two adjacent sub-pixels (SPs) may be the same as the currents (Ioled1, Ioled1) flowing through organic light emitting diodes (OLEDs).

$$I_{d1} + I_{d2} = I_{oled1} + I_{oled2} = 2I_{oled} = 2*I_{s,oled}*e^{V_d/nV_T} = \quad \text{[Equation 8]}$$
$$\frac{1}{2}\mu C_{ox}(V_{gs1} - V_{th})^2 + \frac{1}{2}\mu C_{ox}(V_{gs2} - V_{th})^2$$

Accordingly, the voltages of the second nodes (N2) of the driving transistors (DRTs) are also the same, and the voltage of the second node (N2) of the driving transistor (DRT) may be calculated according to Equation 9.

$$V_{n2} = V_{EL}*nV_T*\ln\left(\frac{\mu C_{ox}\frac{W}{L}}{I_{s,oled}}*\left[\begin{array}{l}(V_{data1} - V_{ref} - V_{th})^2 +\\ (V_{data2} - V_{ref} - V_{th})^2\end{array}\right]\right) \quad \text{[Equation 9]}$$

That is, the voltage of the second node (N2) of the driving transistor (DRT) may be changed based on whether a short occurs between the organic light emitting diodes (OLEDs) of the adjacent sub-pixels (SPs).

In the detection period S730, the first transistor (T1) and the second transistor (2) remain in the turned-off state according to a first scan signal (SCAN1), and the third transistor (T3) is turned on according to a second scan signal (SCAN2).

Accordingly, the sensor 621 may measure the voltage of the first node (N1) of the driving transistor of each sub-pixel via a data line (DL), and sensing values (Vs.sen1 and Vs.sen2), which are measured in the two adjacent sub-pixels according to the voltage of the second node (N2) of the driving transistor (DRT) calculated using Equation 9, may be measured as voltages according to Equation 10.

$$V_{s.sen1} = V_{data1} - V_{ref} + V_{n2}, \; V_{s.sen2} = V_{data2} - V_{ref} + V_{n2} \quad \text{[Equation 10]}$$

The sensing values (Vs.sen1 and Vs.sen2) measured in the two sub-pixels according to Equation 10 are different from reference sensing values (Vsen1 and Vsen2) corresponding to first and second detection driving data voltages (Vdata1 and Vdata2) when the organic light emitting diode (OLED) is in the normal state.

When the voltage level of the first detection driving data voltage (Vdata1) is higher than the voltage level of the second detection driving data voltage (Vdata2), the sensing value (Vs.sen1) of a sub-pixel to which the first detection driving data voltage (Vdata1) is provided may become lower than the reference sensing value (Vsen1) measured in the normal state.

Conversely, the sensing value (Vs.sen2) of a sub-pixel to which the second detection driving data voltage (Vdata2) is provided may become higher than the reference sensing value (Vsen2) measured in the normal state.

Therefore, the determiner 622 may analyze a difference in the voltages between the first and second sensing values (Vsen1 and Vsen2) and the first and second reference sensing values, which are measured in the normal state and stored and correspond to the first detection driving data voltage (Vdata1) and the second detection driving data voltage (Vdata2) provided to the sub-pixels, and may determine whether a short occurs between the organic light emitting diodes (OLEDs) of the adjacent sub-pixels (SPs).

Particularly, in the case of a short occurring between the organic light emitting diodes (OLEDs) of the adjacent sub-pixels, the sensing values (Vsen1 and Vsen2) of the adjacent sub-pixels (SPs) are changed together. Therefore, the determiner 622 may distinguish a short occurring between organic light emitting diodes (OLEDs) of adjacent sub-pixels (SPs) from an open and a short of an organic light emitting diode (OLED) within each sub-pixel.

For ease of description, an operation of determining an open and a short of an organic light emitting diode (OLED) in each sub-pixel and an operation of determining a short occurring between organic light emitting diodes (OLEDs) of adjacent sub-pixels (SPs) are separately described.

However, an open and a short of an organic light emitting diode (OLED) in each sub-pixel and a short occurring between organic light emitting diodes (OLEDs) of adjacent sub-pixels may be detected at the same time by providing different detection driving data voltages to adjacent sub-pixels from among a plurality of sub-pixels according to a data pattern as illustrated in FIG. 8.

The determiner 622 of the detection circuit 620 may compare the currently measured sensing values (Vsen1 and Vsen2) with reference sensing values which are measured in the normal state according to the detection driving data voltages (Vdata1 and Vdata2) provided to sub-pixels.

When the sensing voltage of a predetermined sub-pixel is at least a threshold range higher than a corresponding reference sensing value, and the sensing value of an adjacent sub-pixel is within the threshold range, the determiner 622 may determine that the organic light emitting diode (OLED) of the corresponding sub-pixel is open.

When the sensing voltage of a predetermined sub-pixel is at least a threshold range lower than a corresponding reference sensing value, and the sensing value of an adjacent sub-pixel is within the threshold range, the determiner 622 may determine that the organic light emitting diode (OLED) of the corresponding sub-pixel is shorted.

When the sensing voltage of a predetermined sub-pixel is at least a threshold range higher or lower than a corresponding reference sensing value, and the sensing value of an adjacent sub-pixel is at least a threshold range lower or higher, the determiner 622 may determine that a short occurs between organic light emitting diodes (OLEDs) of adjacent sub-pixels (SPs).

The operation of detecting an open or a short of an organic light emitting diode (OLED) has been described, based on the sub-pixel structure of FIG. 6 in which the detection circuit 620 senses the voltage of the first node (N1) of the driving transistor (DRT).

However, in a similar manner, an open or a short of an organic light emitting diode (OLED) may be also determined in the sub-pixel structure and the detection circuit 510 and 520 of (a) and (b) of FIG. 5.

In (a) and (b) of FIG. 5, the detection circuit 510 and 520 is configured to sense the voltage of the second node (N2) of the driving transistor (DRT), whereby an open or a short of an organic light emitting diode (OLED) may be determined based on the voltage of the second node (N2).

Figure 9:
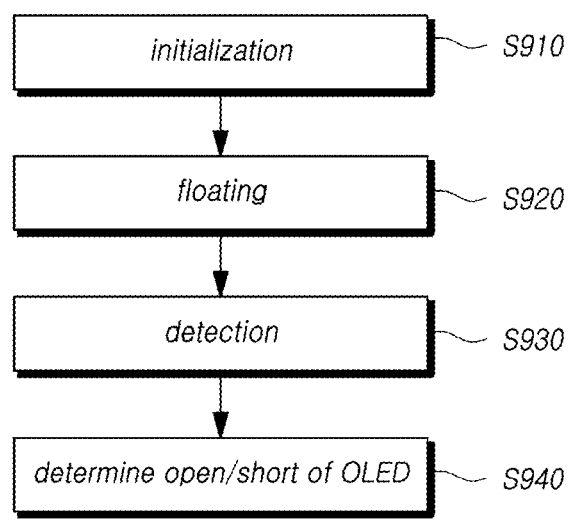
FIG. 9 is a flowchart illustrating a method of driving an organic light emitting display device according to various embodiments.

FIG. 9 is a flowchart illustrating a method of driving an organic light emitting display device according to various embodiments.

Referring to FIG. 9, the method of driving an organic light emitting display device according to the present embodiments may include: operation S910 that turns on a first transistor (T1) and a second transistor (T2), and provides a detection driving data voltage (Vdata) corresponding to predetermined gradation data and a detection driving reference voltage (Vref) to a first node (N1) and a second node (N2) of a driving transistor (DRT), respectively, so as to perform initialization; operation S920 that turns off the first transistor (T1) and the second transistor (T2), and floats the first node (N1) and the second node (N2) of the driving transistor (DRT); operation S930 that detects the voltage of the first node (N1) or the second node (N2) of the driving transistor (DRT) within a predetermined period of time after the first transistor (T1) and the second transistor (T2) are turned off; and operation S940 that determines one of a short and an open of an organic light emitting diode according to the detected voltage of the first node (N1) or the second node (N2).

Using the above-described driving method of the organic light emitting display device, whether the organic light emitting diode (OLED) is open or shorted may be accurately detected.

After the initialization operation S910, floating operation S920, and detection operation S930 are performed with respect to each of all sub-pixels, operation S940 that determines one of a short and an open of an organic light emitting diode may determine whether a short occurs between the organic light emitting diodes (OLEDs) of adjacent sub-pixels, based on an obtained voltage measurement value for a corresponding sub-pixel, and may store a determination result in a memory (not illustrated), together with sub-pixel information (e.g., sub-pixel location information or sub-pixel identification information).

Also, whether a short occurs between organic light emitting diodes (OLEDs) of adjacent sub-pixels may be accurately detected.

Figure 10:
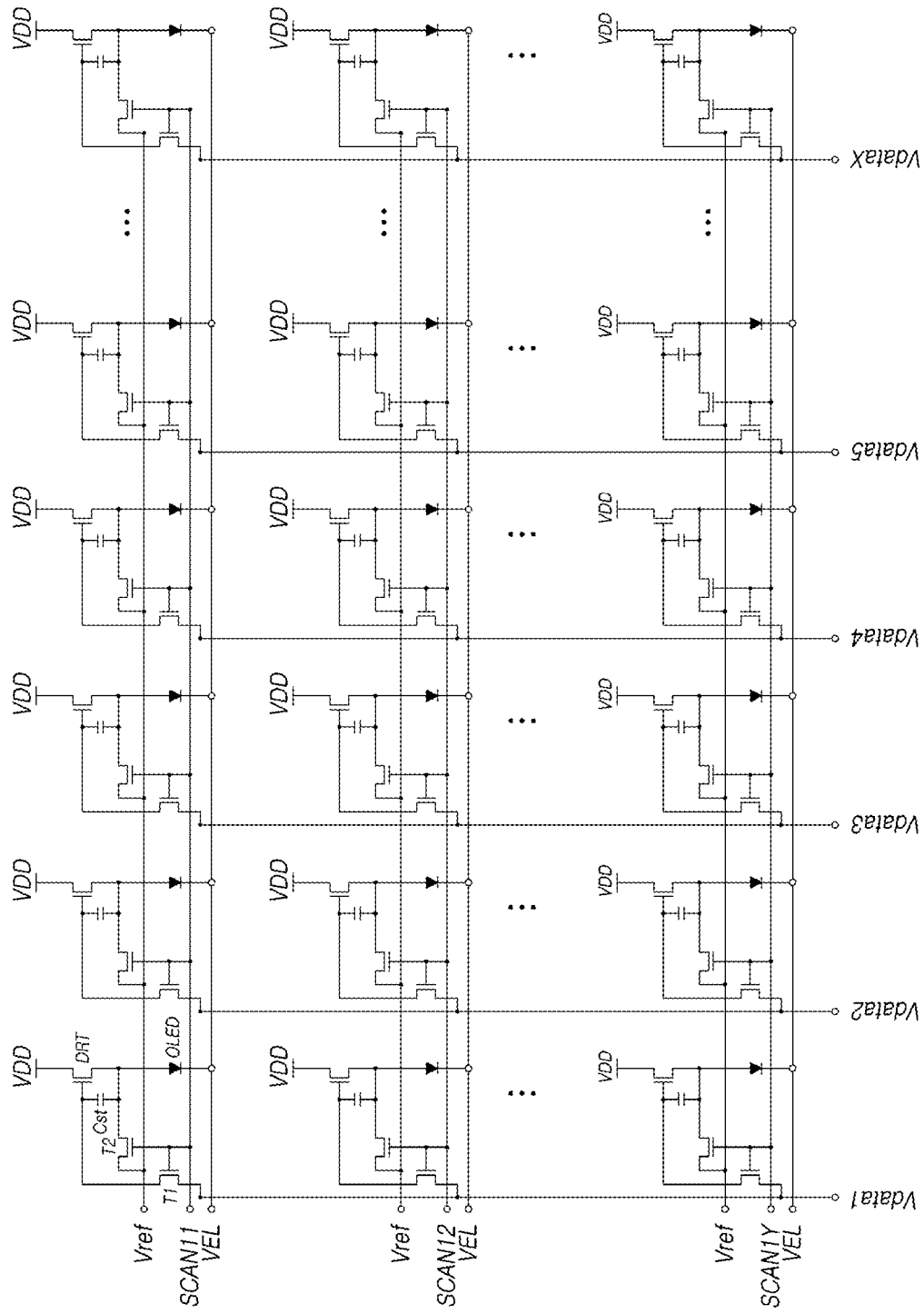
FIGS. 10 to 12 are diagram illustrating pixel array structures according to various embodiments.
Figure 11:
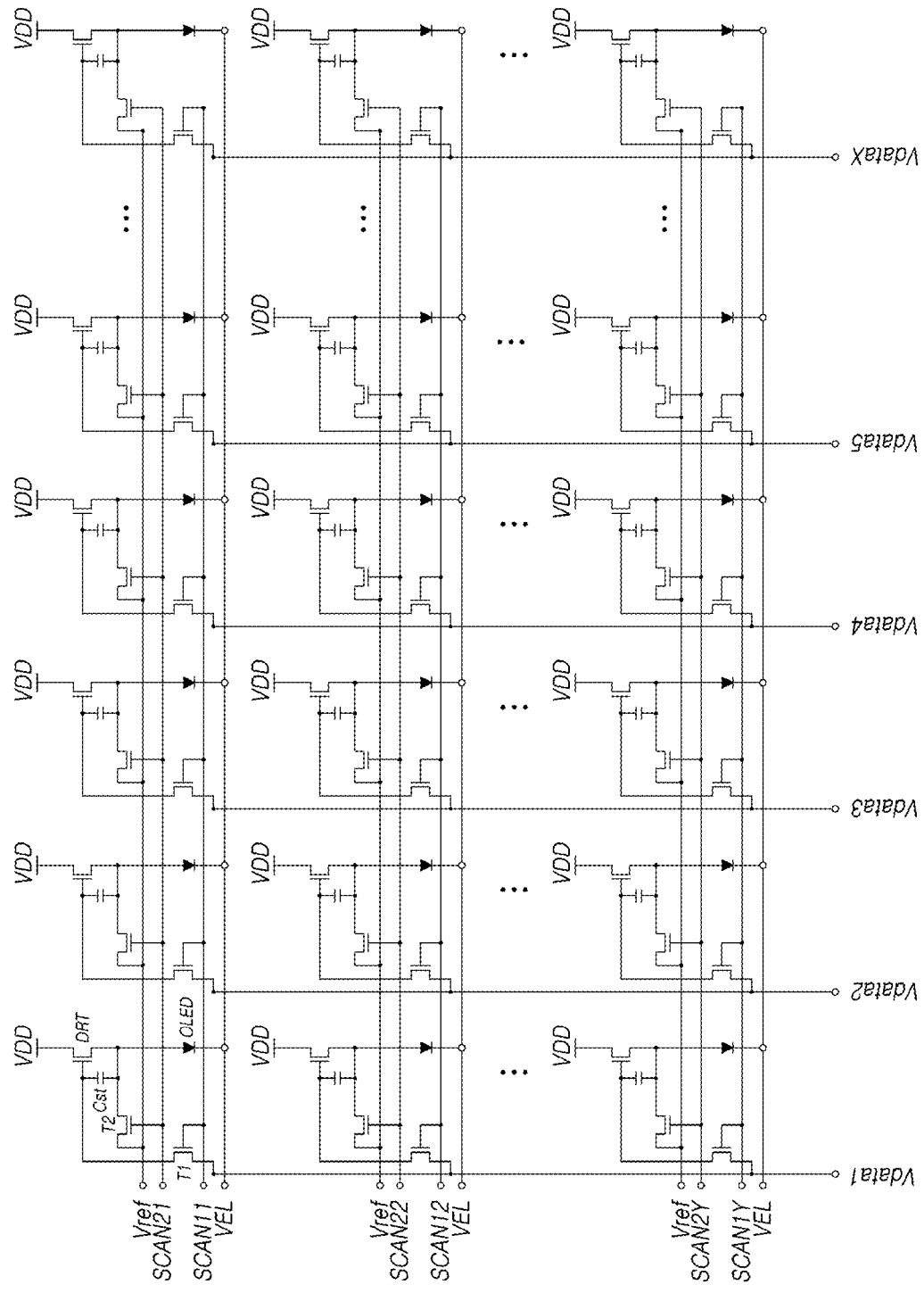
Figure 12:
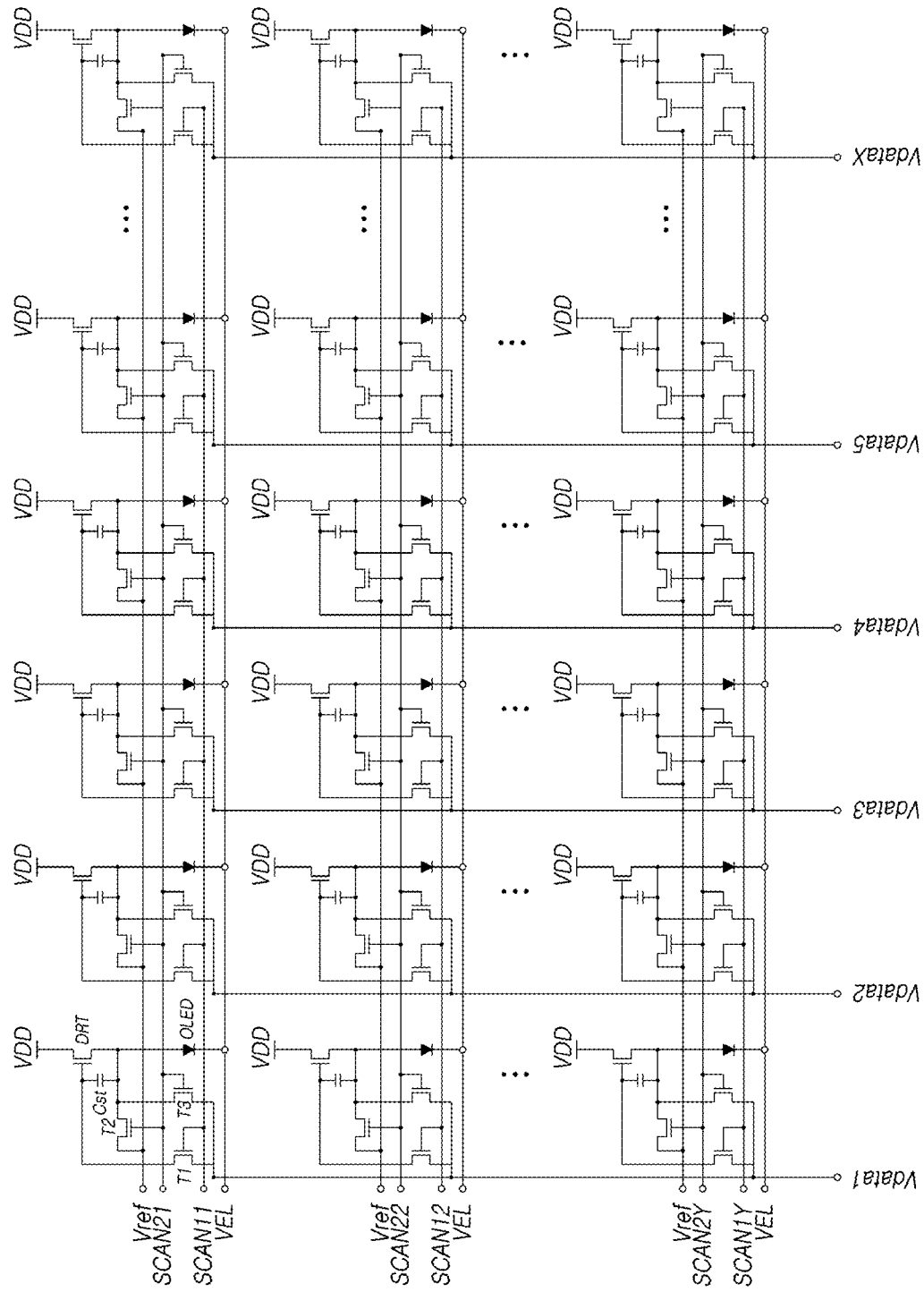

FIGS. 10 to 12 are diagram illustrating the structures of a pixel array according to various embodiments.

Each sub-pixel in a pixel array of FIGS. 10 and 11 drives an organic light emitting diode (OLED) in the same manner as a sub-pixel structure of (a) of FIG. 5, and has a 3T (Transistor)1C (Capacitor) structure including 3 transistors (DRT, T1, and T2) and 1 capacitor (Cst), so as to detect an open or a short of the organic light emitting diode (OLED).

In this instance, a first transistor (T1) and a second transistor (T2) of each sub-pixel are configured to receive the same scan signal (SCAN11~SCAN1Y) in FIG. 10. However, a first transistor (T1) and a second transistor (T2) of each sub-pixel are configured to receive the different scan signals ((SCAN11~SCAN1Y), (SCAN21~SCAN2Y)) in FIG. 11.

In each sub-pixel structure of a pixel array of FIGS. 10 and 11, an open or a short of an organic light emitting diode (OLED) may be detemined by detecting the voltage level of the second node (N2) of the driving transistor (DRT).

FIG. 12 illustrates a pixel array based on a sub-pixel structure of (b) of FIG. 5, which has a 4T (Transistor)1C (Capacitor) structure including 4 transistors (DRT, T1, T2, and T3) and 1 capacitor (Cst).

Each sub-pixel structure of the pixel array of FIG. 12 is also configured to detect the voltage level of a second node (N2) of a driving transistor (DRT), whereby an open or a short of an organic light emitting diode (OLED) may be determined based on the voltage level of the second node (N2) of the driving transistor (DRT).

It will be apparent to those skilled in the art that various modifications and variations can be made in the organic light emitting display device and the driving method thereof of the present disclosure without departing from the technical idea or scope of the disclosure. Thus, it is intended that the present disclosure cover the modifications and variations of this disclosure provided they come within the scope of the appended claims and their equivalents.

What is claimed is:

1. An organic light emitting display device, comprising:
a pixel array in which a plurality of sub-pixels defined by a plurality of data lines and a plurality of gate lines are disposed, wherein an organic light emitting diode, a driving transistor driving the organic light emitting diode, a first transistor electrically connecting a gate node of the driving transistor and a data line which supplies a detection driving data voltage for initializing to the gate node of the driving transistor via the data line, a second transistor electrically connecting a source/drain node of the driving transistor and a reference voltage line which supplies a detection driving reference voltage for initializing to a source/drain node of the driving transistor, and a capacitor connecting the gate node and the source/drain node of the driving transistor are disposed in each sub-pixel;
a driving circuit configured to drive the pixel array; and
a detection circuit configured to detect one or more from among a short and an open of the organic light emitting diode,
wherein, during a predetermined detection period, the driving circuit provides the detection driving data voltage and the detection driving reference voltage to the gate node and the source/drain node of the driving transistor, respectively, and
the detection circuit detects one or more from among a short and an open of the organic light emitting diode according to a voltage of the gate node or the source/drain node of the driving transistor after the gate node and the source/drain node of the driving transistor are floated by turning off the first transistor and the second transistor.

2. The organic light emitting display device of claim 1, wherein the detection circuit comprises:
a driving controller configured to control the driving circuit such that the detection driving data voltage and the detection driving reference voltage are provided to the gate node and the source/drain node of the driving transistor, respectively, and then the gate node and the source/drain node of the driving transistor are floated;
a sensor configured to sense a voltage of the gate node or the source/drain node of the driving transistor and to output a sensing value when the sensor is electrically connected to the gate node or the source/drain node of the driving transistor after the gate node and the source/drain node of the driving transistor are floated; and
a determiner configured to detect one or more from among a short and an open of the organic light emitting diode, based on the sensing value output from the sensor.

3. The organic light emitting display device of claim 2, wherein the driving circuit comprises:
a source driving circuit configured to drive the plurality of data lines;
a gate driving circuit configured to drive the plurality of gate lines; and
a controller configured to control the source driving circuit and the gate driving circuit,
wherein the driving controller and the determiner are included in the controller, and the sensor is included in the source driving circuit.

4. The organic light emitting display device of claim 2, wherein the driving controller is configured to:
perform initialization by turning on the first transistor so as to provide the detection driving data voltage corresponding to predetermined gradation data to the gate node of the driving transistor, and turning on the second transistor so as to provide the detection driving reference voltage having different gradation data with the detection driving data voltage to the source/drain node of the driving transistor;

turn off the first and second transistors, so as to float the gate node and the source/drain node of the driving transistor; and perform control such that the gate node or the source/drain node of the driving transistor is electrically connected to the sensor, after a predetermined period of time elapses.

5. The organic light emitting display device of claim 4, wherein, while the gate node and the source/drain node of the driving transistor are floated, a voltage level of the source/drain node of the driving transistor increases or decreases according to a short or an open state of the organic light emitting diode, and a voltage level of the gate node of the driving transistor, which is connected to the source/drain node of the driving transistor via the capacitor, decreases or increases based on the voltage level of the source/drain node of the driving transistor.

6. The organic light emitting display device of claim 4, wherein the determiner is configured to:

compare the sensing value output from the sensor with a reference sensing value obtained in advance according to the detection driving data voltage in a normal state in which a short or an open does not occur in the organic light emitting diode;

determine that the organic light emitting diode is open when the sensing value is at least a threshold range higher than the reference sensing value; and determine that the organic light emitting diode is shorted when the sensing value is at least a threshold range lower than the reference sensing value.

7. The light emitting display device of claim 2, wherein the sensor is electrically connected to the reference voltage line, and senses the voltage of the source/drain node of the driving transistor via the second transistor.

8. The organic light emitting display device of claim 2, wherein the sub-pixel further comprises a third transistor electrically connecting the data line and one of the gate node and the source/drain node of the driving transistor; and the sensor is electrically connected to the data line, and senses a voltage of one of the gate node and the source/drain node of the driving transistor via the third transistor.

9. The organic light emitting display device of claim 1, wherein the organic light emitting display device is a micro-display type organic light emitting display device that is formed on a silicon substrate.

10. The organic light emitting display device of claim 9, wherein the organic light emitting display device detects one or more from among a short and an open of the organic light emitting diode before the organic light emitting display device is packaged, after the organic light emitting diode is formed on the silicon substrate.

11. The organic light emitting display device of claim 9, wherein the organic light emitting display device is a virtual reality (VR) device or an augmented reality (AR) device.

12. An organic light emitting display device, comprising:
a pixel array in which a plurality of sub-pixels defined by a plurality of data lines and a plurality of gate lines are disposed, wherein an organic light emitting diode, a driving transistor driving the organic light emitting diode, a first transistor electrically connecting a gate node of the driving transistor and a data line which supplies a detection driving data voltage for initializing to the gate node of the driving transistor via the data line, a second transistor electrically connecting a source/drain node of the driving transistor and a reference voltage line which supplies a detection driving reference voltage for initializing to a source/drain node of the driving transistor, and a capacitor connecting the gate node and the source/drain node of the driving transistor are disposed in each sub-pixel;

a driving circuit configured to drive the pixel array; and a detection circuit configured to detect one or more from among a short and an open of the organic light emitting diode, wherein, during a predetermined detection period, the driving circuit provides different detection driving data voltages to adjacent sub-pixels from among the plurality of sub-pixels according to a predetermined data pattern, and the detection circuit detects a short error occurring between organic light emitting diodes of the adjacent sub-pixels according to a voltage of the gate node or the source/drain node of the driving transistor after the gate node and the source/drain node of the driving transistor are floated by turning off the first transistor and the second transistor.

13. The organic light emitting display device of claim 12, wherein the detection circuit comprises:

a driving controller configured to control the driving circuit such that the gate node and the source/drain node of the driving transistor are floated after the detection driving reference voltage is provided to the source/drain node of the driving transistor and detection driving data voltages having different gradation data with each other are provided to gate nodes of driving transistors of adjacent sub-pixels;

a sensor configured to sense a voltage of the gate node or the source/drain node of the driving transistor and to output a sensing value when the sensor is electrically connected to the gate node or the source/drain node of the driving transistor after the gate node and the source/drain node of the driving transistor are floated; and a determiner configured to detect an error of an organic light emitting diode of each sub-pixel, based on the sensing value output from the sensor, and to determine a short error occurring between organic light emitting diodes of adjacent sub-pixels, based on an error occurring between the organic light emitting diodes of the adjacent sub-pixels.

14. The organic light emitting display device of claim 13, wherein the determiner is configured to determine an error of an organic light emitting diode of an individual sub-pixel that is not adjacent as one of a short error and an open error of the organic light emitting diode.

15. A driving method of an organic light emitting display device comprising: a pixel array in which a plurality of sub-pixels defined by a plurality of data lines and a plurality of gate lines are disposed, wherein an organic light emitting diode, a driving transistor driving the organic light emitting diode, a first transistor electrically connecting a gate node of the driving transistor and a data line which supplies a detection driving data voltage for initializing to the gate node of the driving transistor via the data line, a second transistor electrically connecting a source/drain node of the driving transistor and a reference voltage line which supplies a detection driving reference voltage for initializing to a source/drain node of the driving transistor, and a capacitor connecting the gate node and the source/drain node of the driving transistor are disposed in each sub-pixel; a driving circuit; and a detection circuit, the method comprising:
- performing initialization by turning on the first transistor so as to provide the detection driving data voltage corresponding to predetermined gradation data to the gate node of the driving transistor, and by turning on the second transistor so as to provide the detection driving reference voltage having different gradation data with the detection driving data voltage to the source/drain node of the driving transistor;
- turning off the first and second transistors after the gate node and the source/drain node of the driving transistor are initialized, so as to float the gate node and the source/drain node of the driving transistor; and
- detecting a voltage of the gate node or the source/drain node of the driving transistor within a predetermined period of time after the gate node and the source/drain node of the driving transistor are floated, and determining one or more from among a short and an open of the organic light emitting diode.

16. A driving method of an organic light emitting display device comprising: a pixel array in which a plurality of sub-pixels defined by a plurality of data lines and a plurality of gate lines are disposed, wherein an organic light emitting diode, a driving transistor driving the organic light emitting diode, a first transistor electrically connecting a gate node of the driving transistor and a data line, a second transistor electrically connecting a source/drain node of the driving transistor and a reference voltage line, and a capacitor connecting the gate node and the source/drain node of the driving transistor are disposed in each sub-pixel; a driving circuit; and a detection circuit, the method comprising:
- performing initialization by turning on the first transistor so as to provide different detection driving data voltages having different gradation data with each other to gate nodes of driving transistors of adjacent sub-pixels from among the plurality of sub-pixels according to a predetermined data pattern, and by turning on the second transistor so as to provide a detection driving reference voltage to the source/drain node of the driving transistor;
- turning off the first and second transistors after the gate node and the second node of the driving transistor are initialized, so as to float the first node and the source/drain node of the driving transistor; and
- detecting a voltage of the gate node or the source/drain node of the driving transistor within a predetermined period of time after the gate node and the source/drain node of the driving transistor are floated, and determining a short error occurring between organic light emitting diodes of the adjacent sub-pixels.

* * * * *